(12) United States Patent
Johnson et al.

(10) Patent No.: US 11,797,186 B2
(45) Date of Patent: Oct. 24, 2023

(54) LATENCY OFFSET FOR FRAME-BASED COMMUNICATIONS

(71) Applicant: Micron Technology, Inc., Boise, ID (US)

(72) Inventors: James Brian Johnson, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 395 days.

(21) Appl. No.: 16/951,299

(22) Filed: Nov. 18, 2020

(65) Prior Publication Data

US 2021/0191622 A1    Jun. 24, 2021

Related U.S. Application Data

(60) Provisional application No. 62/951,783, filed on Dec. 20, 2019.

(51) Int. Cl.
G06F 3/06        (2006.01)

(52) U.S. Cl.
CPC .......... G06F 3/0611 (2013.01); G06F 3/0659 (2013.01); G06F 3/0679 (2013.01)

(58) Field of Classification Search
CPC ..... G06F 3/0611; G06F 3/0659; G06F 3/0679
See application file for complete search history.

(56) References Cited

U.S. PATENT DOCUMENTS

| | | |
|---|---|---|
| 2007/0038829 A1 | 2/2007 | Tousek |
| 2011/0164460 A1 | 7/2011 | Kajigaya et al. |
| 2014/0122948 A1 | 5/2014 | Cheng |
| 2015/0058706 A1 | 2/2015 | Bains |
| 2015/0243343 A1 | 8/2015 | Giovannini et al. |
| 2017/0084325 A1 | 3/2017 | Shimizu et al. |
| 2019/0036531 A1 | 1/2019 | Bains et al. |
| 2019/0107974 A1 | 4/2019 | Prather |

(Continued)

FOREIGN PATENT DOCUMENTS

| | | |
|---|---|---|
| CN | 104471645 A | 3/2015 |
| CN | 109690677 A | 4/2019 |
| DE | 102008015544 A1 | 7/2009 |

OTHER PUBLICATIONS

International Search Report and Written Opinion received for PCT Patent Application No. PCT/US20/62034, dated Mar. 15, 2021, 7 pages.

(Continued)

*Primary Examiner* — Kalpit Parikh
(74) *Attorney, Agent, or Firm* — Holland & Hart LLP

(57) ABSTRACT

Methods, systems, and devices for latency offset for frame-based communications are described. A memory system may include a host device and a memory device that communicate using frames based on a frame period of a frame clock. The memory device may receive a read command and a write command from the host device, and determine a read latency and a write latency corresponding to the received commands. The memory device may also determine an additional offset latency to add to the write latency to avoid bus contention between read data and write data associated with the read command and the write command, respectively. The offset latency may correspond to an integer quantity of clock periods, which may be less than the frame period.

35 Claims, 13 Drawing Sheets

(56) References Cited

U.S. PATENT DOCUMENTS

2020/0051604 A1 2/2020 Zamani et al.
2020/0301606 A1* 9/2020 Muthiah ............... G06F 3/0659

OTHER PUBLICATIONS

Chinese Patent Office, "Office Action", issued in connection with Chinese Patent Application No. 202080088977.7 dated Dec. 28, 2022 (5 pages) (4 pages of English Translation and 5 pages of Original Document).

* cited by examiner

LATENCY OFFSET FOR FRAME-BASED COMMUNICATIONS

CROSS REFERENCE

The present application for patent claims the benefit of U.S. Provisional Patent Application No. 62/951,783 by JOHNSON et al., entitled "LATENCY OFFSET FOR FRAME-BASED COMMUNICATIONS," filed Dec. 20, 2019, assigned to the assignee hereof, and expressly incorporated by reference herein.

BACKGROUND

The following relates generally to one or more memory systems and more specifically to latency offset for frame-based communications.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
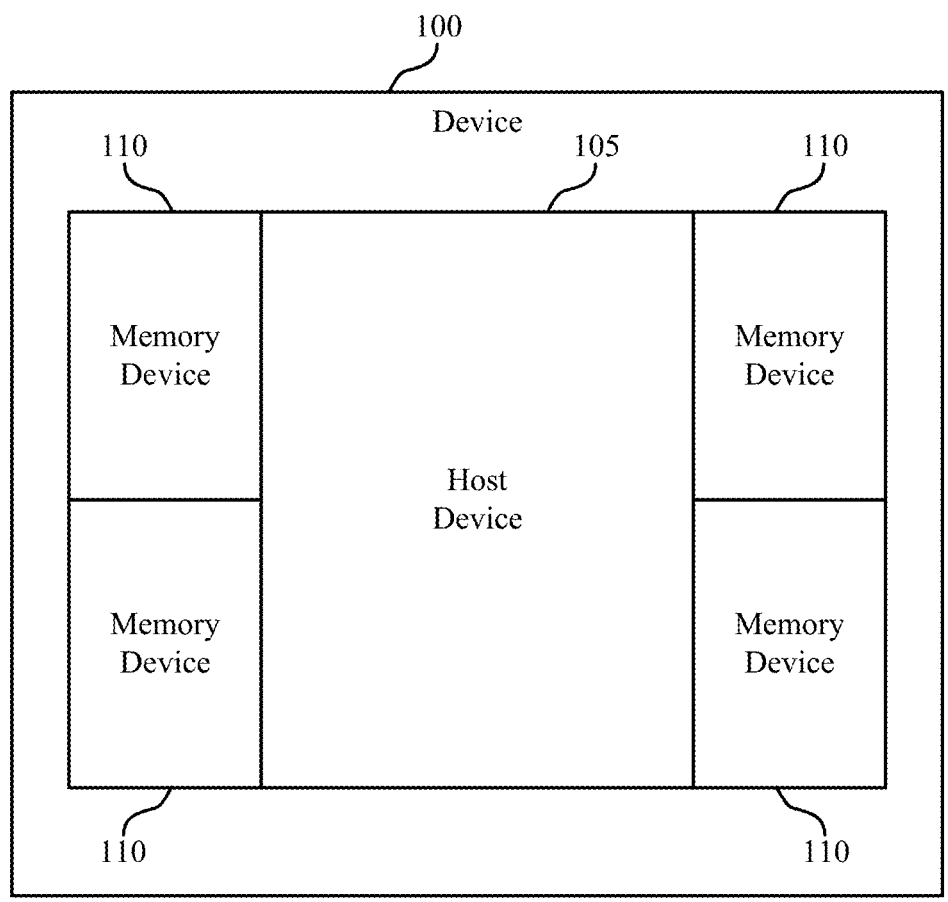
FIG. 1 illustrates an example of a device that supports latency offset for frame-based communications in accordance with examples as disclosed herein.

A host device and a memory device may be configured to transfer large amounts of data quickly. For example, the host device may request that the memory device communicate data at or around four terabytes per second (TB/s). In some examples, to facilitate such high data rates, every symbol of a frame may be used to communicate data or control information and may not be used in communicating overhead signaling, such as headers. Instead, the memory device may perform a frame training procedure that identifies a frame boundary and generates a frame clock to identify the beginning, the end, or other segments of a frame. The memory device may use the generated frame clock for processing commands and data from the host device. However, a read return clock (RCK) for transmitting data from the memory device to the host device may not be aligned with the generated frame clock.

A memory device may receive a read command and a write command from a host device. In some examples, the read command and the write command may be combined in a read-write command from the host device. The memory device may determine a read latency for read data associated with the read command and a write latency for write data associated with the write command. The write command and the write data may have the same delay path from the host device to the memory device, and so the write latency may include a discrete quantity of frame periods. In some examples, the write latency may be established by the host device and transmitted to the memory device. The read latency, on the other hand, may include an additional circuit delay associated with accessing the data at the memory device. The total read latency may thus include a discrete portion indicated by the host device, along with the additional circuit delay. This may create a problem for read-to-write timing on a bidirectional bus between the host device and the memory device. For example, if the write latency is programmed to allow write data to arrive at the memory device immediately following read data, the additional circuit delay included in the read latency may result in contention between read and write data on the bidirectional bus.

Techniques are described herein for determining a latency offset between receiving data and transmitting data at a memory device. A memory device may receive a read command and a write command from a host device, and determine a read latency and a write latency corresponding to the received commands. The memory device may also determine an additional offset latency to add to the write latency to avoid bus contention between read data and write data associated with the read command and the write command, respectively. The offset latency may correspond to an integer quantity of clock periods, which may be less than a frame period of a frame clock. In some examples, the offset latency may be stored by a mode register of the memory device. In some examples, the host device may determine the offset latency during an initialization and training of a communications channel. The techniques described herein, which may include determining the offset latency, may enable the memory device and the host device to improve communications reliability, among other benefits.

Features of the disclosure are initially described in the context of memory devices and dies as described with reference to FIGS. 1-2. Features of the disclosure are described in the context of a frame structure, a process flow, timing diagrams, and a system as described with reference to FIGS. 3-8. These and other features of the disclosure are further illustrated by and described with reference to apparatus diagrams and flowcharts that relate to latency offset for frame-based communications as described with references to FIGS. 9-12.

FIG. 1 illustrates an example of a device 100 that supports latency offset for frame-based communications in accordance with examples as disclosed herein. The device 100 may include a host device 105 and a plurality of memory devices 110. The plurality of memory device 110 may be examples a finer grain memory device (e.g., finer grain random-access memory (RAM), such as finer grain dynamic RAM (DRAM) or finer grain ferroelectric RAM (FeRAM)).

The host device 105 may be an example of a processor (e.g., a central processing unit (CPU), a graphics processing unit (GPU)) or a system on a chip (SoC). In some cases, the host device 105 may be separate component from the memory device such that the host device 105 may be manufactured separately from the memory device. In some cases, the host device 105 may be external to the memory device 110 (e.g., a laptop, server, personal computing device, smartphone, personal computer). In the device 100, the memory devices 110 may be configured to store data for the host device 105. The host device 105 may exchange information with the memory devices 110 using signals communicated over signal paths. In some cases, the signal paths at least partially include an interposer (silicon or organic).

In some situations, the device 100 may perform better using a high-speed connection between the host device 105 and the memory devices 110. As such, some memory devices 110 support applications, processes, host devices, or processors that have multiple TB/s bandwidth needs. Satisfying such a bandwidth constraint within an acceptable energy budget poses challenges.

The memory devices 110 may be configured such that the signal path between the memory cells in the memory devices 110 and the host device 105 are as short as possible. For example, the memory devices 110 may be bufferless memory devices. In another example, the data channels coupling a memory device 110 with the host device 105 may be configured to be shorter than previous designs.

In some cases, an interposer may be used to couple the memory devices 110 with the host device 105. Depending on the constraints of the host device 105 (e.g., bandwidth constraints), various different types of interposers may be used (e.g., silicon interposers or organic interposers). The memory dies of the memory devices 110 may be configured to work with multiple types of interposers. As such, the memory dies of the memory devices 110 may be reconfigurable based on a type of the interposer used to couple the host device 105 with the memory devices 110.

In some cases, the interposer may be a high-density interposer such as a silicon interposer. A high-density interposer may be configured to provide wide communication lanes between connected components (e.g., a memory device 110 and a host device 105). The high-density interposer may include a plurality of high-resistance channels for communicating between devices. The channels may be completely independent of one another in some cases. Some channels may be unidirectional and some channels may be bidirectional.

The high-density interposer may provide wide communication lanes by offering a high quantity of channels to connect components. In some cases, the channels may be thin traces of connecter (e.g., copper), thereby making each individual channel lossy. Because each channel may be highly resistive, as the frequency of data transferred increases, the power needed to transfer the data goes up in a non-linear relationship with the frequency. Such characteristics may impose a practical frequency ceiling that can be used to transmit data given an amount of transmit power over a channel of the high-density interposer. To increase the amount of data transferred in a given amount of time, the high-density interposer may include a very high quantity of channels. As such, a bus of a memory device 110 may be wider than other types of interposer (e.g., organic interposers) used in some DRAM architectures, such as DDR4 (double data rate fourth-generation synchronous dynamic random-access memory) or GDDR5 (double data rate type five synchronous graphics random-access memory). The interposer (whether it is silicon or organic) may be formed of a first material (e.g., silicon or organic) that is different from a second material that forms a substrate of the package.

Other characteristics of the memory devices 110 may also be determined based on the performance constraints and/or the type of the interposer. For example, a channel width of the data channel may be determined. In some memory devices 110, the quantity of data channels may be fixed by legacy technology (e.g., the quantity of data channels between the host device 105 and the memory device 110 may be sixteen data channels). As the channel width goes up, the quantity of pins used to communicate payload data, control data, and/or clock signals may be increased. In other examples, the quantity of banks in a cell region, or said another way, the quantity of banks accessed using a single data channel, may be determined based on the performance constraints and/or the type of the interposer. In other examples, the quantity of clock signals used in the memory devices 110 may be determined based on the performance constraints and/or the type of the interposer. In addition, various characteristics of the clock signals may be determined based on the performance constraints and/or the type of the interposer. For example, the frequency and phase of the clock signals may be determined based on the performance constraints and/or the type of the interposer. In other examples, the use of an error correction code (ECC) pin may be determined based on the performance constraints and/or the type of the interposer. In other examples, pin drivers may be activated or deactivated, as the case may be, based on the performance constraints and/or the type of the interposer. In other examples, whether a memory device 110 includes data channel pairs may be based on the performance constraints and/or the type of the interposer. In other examples, a modulation scheme (e.g., non-return-to-zero (NRZ) or four-symbol phase amplitude modulation (PAM4)) for signals communicated over the pins may be determined based on the performance constraints and/or the type of the interposer.

The memory devices 110 may include one or more vias (e.g., through-silicon vias (TSVs)). In some cases, the one or more vias may be part of internal signal paths that couple controllers with memory cells. The vias may be used to communicate between memory devices 110. In some cases, some vias may be used to facilitate communication between the host device 105 and at least some of the memory devices 110. In some cases, a single via may be coupled with multiple memory devices 110.

In some examples, to facilitate high data rates, every symbol of a frame may be used to communicate data or control information between a memory device 110 and a host device 105. The memory device 110 may generate a frame clock for processing commands and data from the host device 105, for example by performing a frame training procedure. However, an RCK for transmitting data from the memory device 110 to the host device 105 may not be aligned with the generated frame clock, which may lead to data contention on a bidirectional bus between the host device 105 and the memory device 110. The memory device 110 may determine an offset latency, which may be added to a write latency associated with a write command in order to avoid bus contention between read data from the memory device 110 and write data from the host device 105. The offset latency may correspond to an integer quantity of clock periods, which may be less than a frame period of the generated frame clock. Determining the offset latency may improve communications reliability between the memory device 110 and the host device 105, among other benefits.

Figure 2:
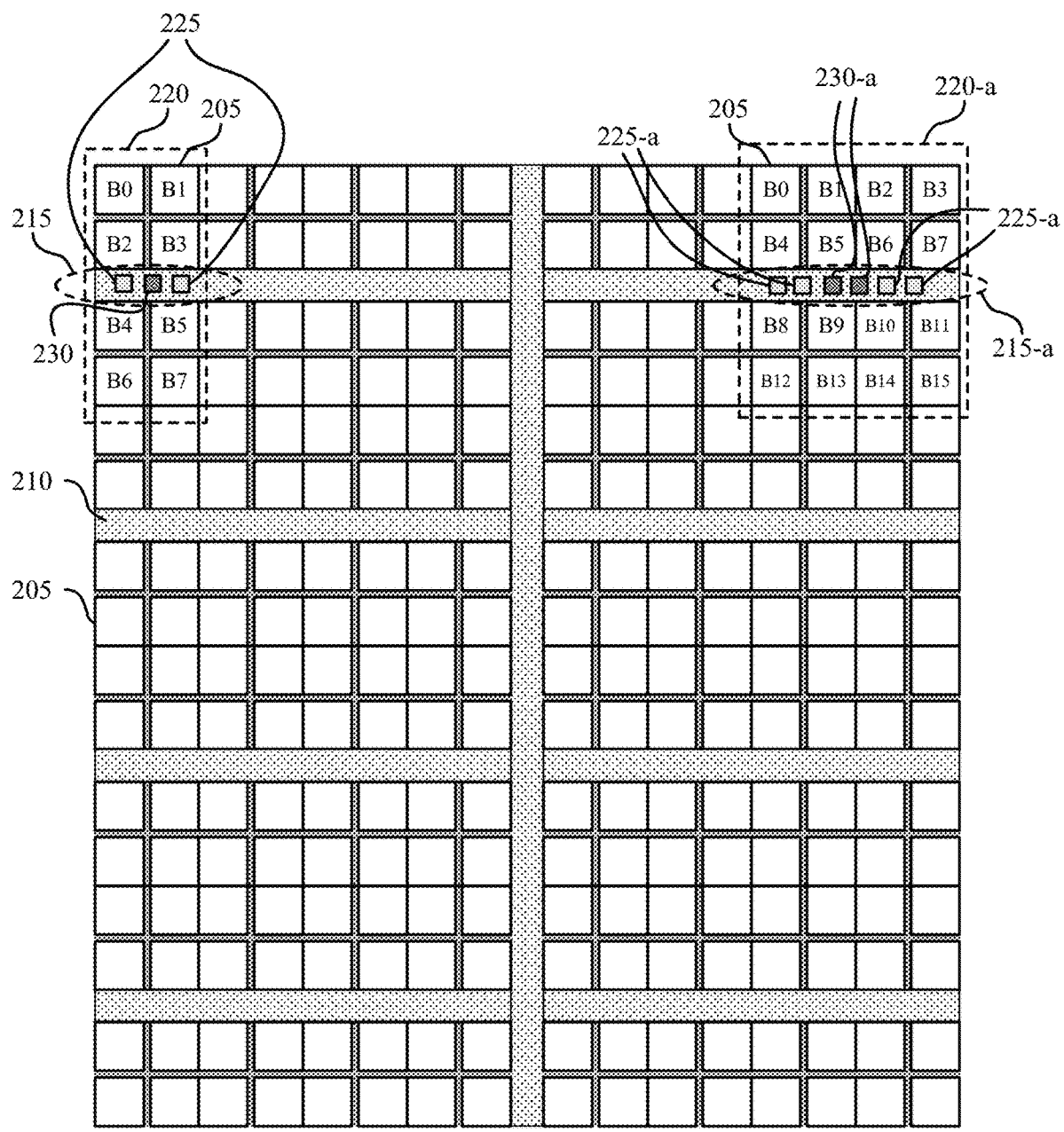
FIG. 2 illustrates an example of a memory die that supports latency offset for frame-based communications in accordance with examples as disclosed herein.

FIG. 2 illustrates an example of a memory die 200 that supports latency offset for frame-based communications in accordance with examples as disclosed herein. In some cases, the memory die 200 may be referred to as a memory array, an array of memory cells, or a deck of memory cells. The various components of the memory die 200 may be configured to facilitate high bandwidth data transfer between the host device and a memory device with which the memory die 200 is associated.

The memory die 200 may include a plurality of banks 205 of memory cells (as represented by the white boxes), a plurality of input/output (I/O) areas 210 (sometimes referred to as I/O regions or I/O stripes) traversing the memory cells of the memory die 200, and a plurality of data channels 215 that couple the memory die 200 with the host device. Each of the banks 205 of memory cells include a plurality of memory cells configured to store data. The memory cells may be DRAM memory cells, FeRAM memory cells, or other types of memory cells described herein. The plurality of I/O areas 210 may include a plurality of power pins and ground pins configured to couple the memory cells of the memory die 200 with power and ground.

The memory die 200 may be divided into cell regions 220 associated with different data channels 215. For example, a single data channel 215 may be configured to couple a single cell region 220 to the host device. The pins of the I/O area may be configured to couple multiple cell regions 220 of the memory die 200 to power, ground, virtual ground, and/or other supporting components.

To provide a high throughput of data (e.g., multiple TB/s) between a host device (not shown) and the memory die 200, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path.

In some examples, the memory die 200 may be partitioned into a plurality of cell regions 220. Each cell region 220 may be associated with a data channel 215. Two different types of cell region 220 are illustrated, but the entire memory die 200 may be populated with any quantity of cell regions 220 having any shape. A cell region 220 may include a plurality of banks 205 of memory cells. There may be any quantity of banks 205 in a cell region 220. For example, the memory die 200 illustrates a first cell region 220 that includes eight banks 205 and a second cell region 220-a that includes sixteen banks 205-a. Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 220 may be selected based on the bandwidth constraints of the host device, the power constraints of the host device or the memory device, the size of the data channel, the type of interposer used to couple the memory die 200 with the host device, a data rate associated with the data channel, other considerations, or combinations thereof. In some cases, the memory die 200 may be partitioned such that each cell region 220 is the same size. In other cases, the memory die 200 may be partitioned such that the memory die 200 has cell regions 220 of different sizes.

A data channel 215 (associated with a cell region) may include pins for coupling the memory cells of the cell region 220 with the host device. At least a portion of the data channel 215 may comprise channels of the interposer. The data channel 215 may include a data width specifying how many data pins 225 (sometimes referenced as DQ pins) are in the data channel 215. The quantity of pins in the data channel 215 may be based on the quantity of layers in the memory device because a single data channel 215 may be configured to couple with multiple layers. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 230. Each memory cell in the cell region 220 may be configured to transfer data to and from the host device using the pins 225, 230 associated with the cell region 220. The data channel 215 may also include a clock pin (e.g., CLK) and/or a register clock pin (e.g., RLCK). In some cases, the data channel 215 may include an ECC pin (not shown) for facilitating error detection and correction procedures.

In some cases, the I/O area 210 may bisect the banks 205 of memory cells in the cell region 220. In this manner, the data path for any individual memory cell may be shortened. The C/A pin 230 may be configured to communicate command frames between the memory die 200 and the host device.

The memory die 200 may receive a read command followed by a write command (e.g., via the C/A pin 230) from the host device. The read command may identify read data to be retrieved from memory cells and communicated to the host device, for example via the data pins 225. Similarly, the write command may identify write data to be received from the host device (e.g., via the data pins 225) and written to memory cells. The read data may have an associated read latency, and the write data may have an associated write latency. The write command and the write data may have the same delay path from the host device to the data channel 215, and so the write latency may include a discrete quantity of frame periods. In some examples, the write latency may be established by the host device and indicated to the memory device. The read latency, on the other hand, may include an additional circuit delay associated with accessing the read data from the memory cells. The total read latency may thus include a discrete portion indicated by the host device, along with the additional circuit delay. This may create a problem for read-to-write timing on the data channel 215. For example, if the write latency is programmed to allow the write data to arrive at the memory die 200 immediately following transmission of the read data, the additional circuit delay included in the read latency may result in contention on the data channel 215 between the read data and the write data.

To avoid the contention, an offset latency may be added to the write latency associated with the write data on the data channel 215. The offset latency may correspond to an integer quantity of clock periods, which may be less than a frame period of a frame clock. In some examples, the offset latency may be programmed into a mode register of the memory device. In some examples, the host device may determine the offset latency during an initialization and training of the data channel 215, and the offset latency may be programmed into the mode register based on the training. Determining the offset latency may improve communications reliability between the memory die 200 and the host device, among other benefits.

Figure 3:
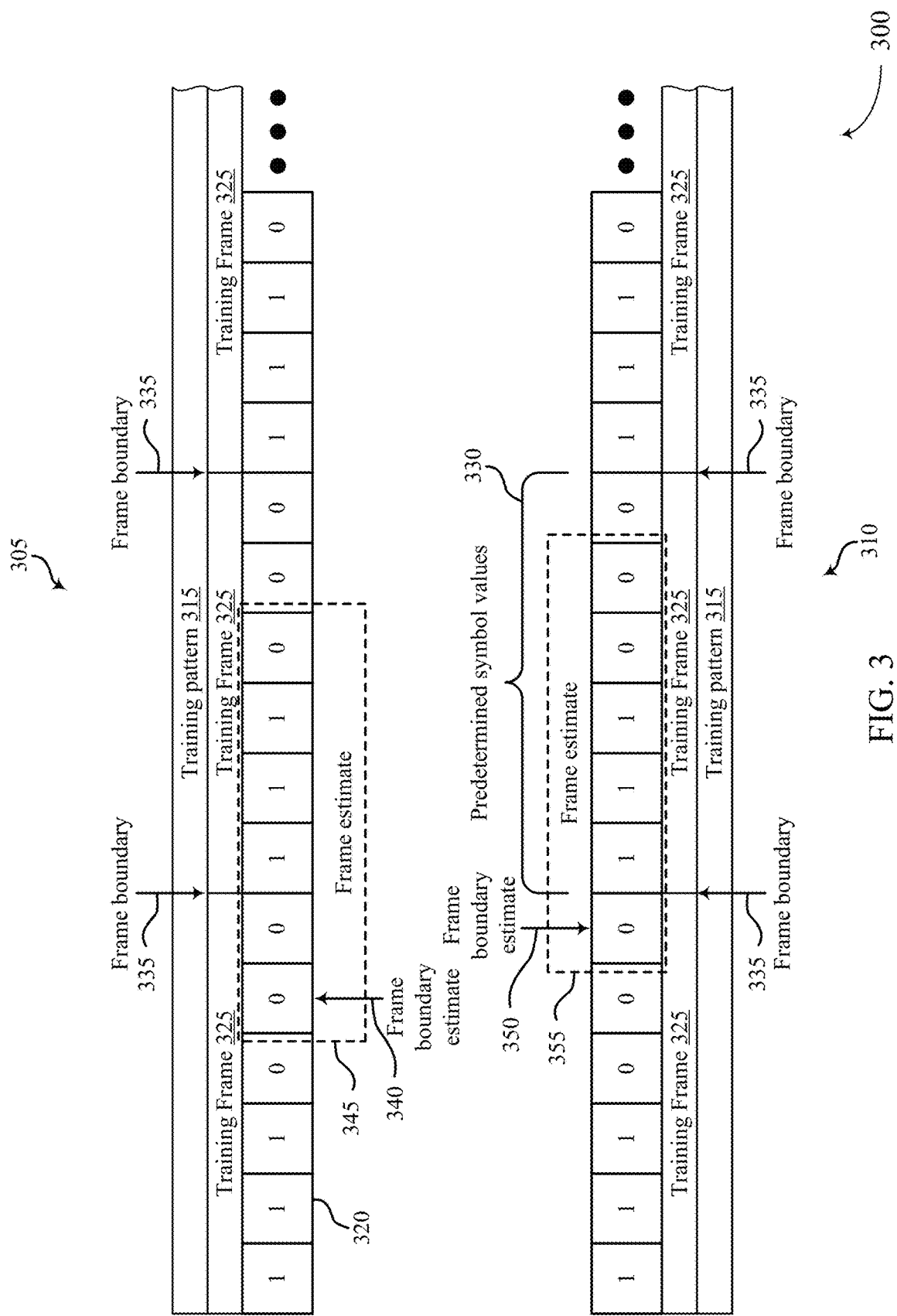
FIG. 3 illustrates an example of a structure for a frame training procedure that supports latency offset for frame-based communications in accordance with examples as disclosed herein.

FIG. 3 illustrates an example of a structure 300 for a frame training procedure that supports latency offset for frame-based communications in accordance with examples as disclosed herein. The structure 300 shows two instances (e.g., a first instance 305 and a second instance 310) of a training pattern 315. Each instance 305, 310 shows a step in the frame training procedure. A frame may refer to a unit of data communicated between a host device and a memory device. The frame may include a quantity of bits communicated after an identified frame boundary. In some cases, a frame may be referred to as a packet.

The frame training procedure is a process by which the memory device identifies a correct frame boundary. With the frame boundary, the memory device may generate a frame clock, which is used to identify frame boundaries (i.e., the start and stop of a frame) during an entire active session. The frame clock may be based on a system clock, a symbol length, and a frame length. In some examples, the system clock may be a write clock (WCK) at a host device. In some cases, the frame clock is a virtual clock that relies on the system clock for its timing. In other cases, the frame clock is a physical clock that is initialized to track the frames.

The training pattern 315 comprises a long train of symbols 320 that are set to predetermined symbol values used to identify a frame boundary. The training pattern 315 may comprise a plurality of training frames 325, each training frame 325 comprising an ordered set of predetermined symbol values 330. An example of the symbol values may be a set of logic '1's followed by a set of logic '0's, or vice versa. The training frame 325 may have a frame length that is equal to a frame length of the frames transmitted by the host device during the active session. Using a plurality of training frames, the memory device may be configured to determine a frame boundary 335 and generate a frame clock that is used to identify the beginning of frames (or the end as the case may be) during the active session.

During the activation time period and as part of a frame training procedure, the host device may transmit the training pattern 315 to the memory device. The memory device may determine when the training pattern is being transmitted so that it may be ready to initialize the frame training procedure.

As shown in the first instance, 305, upon receiving the training pattern 315, the memory device identify a symbol of the training pattern as a first frame boundary estimate 340. Using the first frame boundary estimate and/or a known frame length, the memory device may generate a first frame estimate 345. The first frame estimate 345 include a quantity of symbols of the training pattern 315 equal to the frame length of a training frame 325. The memory device may identify the ordered set of symbols of the first frame estimate 345. The memory device may compare the ordered set of symbols of the first frame estimate 345 to the ordered set of predetermined symbol values 330.

If the ordered set of symbols of the first frame estimate 345 matches the ordered set of predetermined symbol values 330, the memory device may identify the rising edge of the symbol that comprises the first frame boundary estimate 340 as the frame boundary. If the sets do not match, the memory device may a second frame boundary estimate 350 and a second frame estimate 355 as shown in the second instance 310. The memory device may then repeat the same process of comparing the set of symbol values in the second frame estimate 355 to the ordered set of predetermined symbol values 330. This process may continue until a correct frame boundary is found.

In some cases, the difference between the first frame boundary estimate 340 and the second frame boundary estimate 350 may be one symbol. In such cases, the memory device may slip the boundary estimate one symbol upon determining that the frame boundary is not correct. In other cases, the memory device may select the second frame boundary estimate 350 based on a predetermined symbol distance (e.g., one, two, three, four, five, six symbols, etc.). In some cases, the memory device may select the second frame boundary estimate based on the ordered set of symbol values found in the first frame estimate 345. For example, if the memory device knows that the predetermined set of symbol values is 111000 and the set of symbol values of the first frame estimate 345 is 001110, the memory device may identify the third symbol of the first frame estimate 345 as the second frame boundary estimate 350.

Once the memory device identifies the correct frame boundary, the memory device may generate a frame clock based on the frame synchronization process. The frame clock may indicate the beginning of a new frame through the active session. Using the frame clock, the memory device and the host device may not need to use headers to indicate the location of frames, thereby freeing up more symbols for substantive data. In some cases, the frame boundary may be aligned with a rising edge of a first symbol (or a first symbol period) in the frame. As such, the frame clock may also be aligned with a rising edge of the symbol period of the frame.

The memory device may use the generated frame clock for processing commands and data from the host device. However, an RCK, which may be used for timing a transmission of data from the memory device to the host device, may not be aligned with the generated frame clock, for example due to a circuit delay within the memory device. This may lead to data contention on a bidirectional bus between the host device and the memory device. For example, the memory device may receive a read command identifying read data, followed by a write command identifying write data. The read command may indicate the read data is to be transmitted to the host device after a quantity of frames following the read command, where the quantity of frames may correspond to a read latency. Similarly, the write command may indicate the write data is to be received from the host device after a quantity of frames following the write command, where the quantity of frames may correspond to a write latency. In some examples, such as when the write command immediately follows the read command, the write latency may be one frame greater than the read latency. The write latency and the commands may have the same delay path from the host device to the memory device, and so the write latency may be aligned with the generated frame clock. The read latency may also be based on the generated frame clock, and so may not include the circuit delay at the memory device. As a result, the frames in which the memory device transmits the read data may overlap with the frames in which the memory device is to receive the write data, which may lead to contention on the data bus and reduce reliability of communications between the host device and the memory device.

To reduce the data bus contention and improve communications reliability, the memory device may determine an additional offset latency to add to the write latency. The offset latency may correspond to an integer quantity of clock periods of the system clock (e.g., the WCK), and may be less than a frame period of the generated frame clock. In some examples, the memory device and the host device may determine the offset latency during the frame training procedure. Additionally or alternatively, the offset latency may be programmed into a mode register of the memory device. For example, as part of the frame training procedure (or based on the training procedure), the host device or the memory device may write the offset latency into the mode register of the memory device. Subsequently, when the memory device receives the read command and the write command, the memory device may retrieve the offset latency programmed into the mode register as part of determining the latencies associated with the commands.

Figure 4:
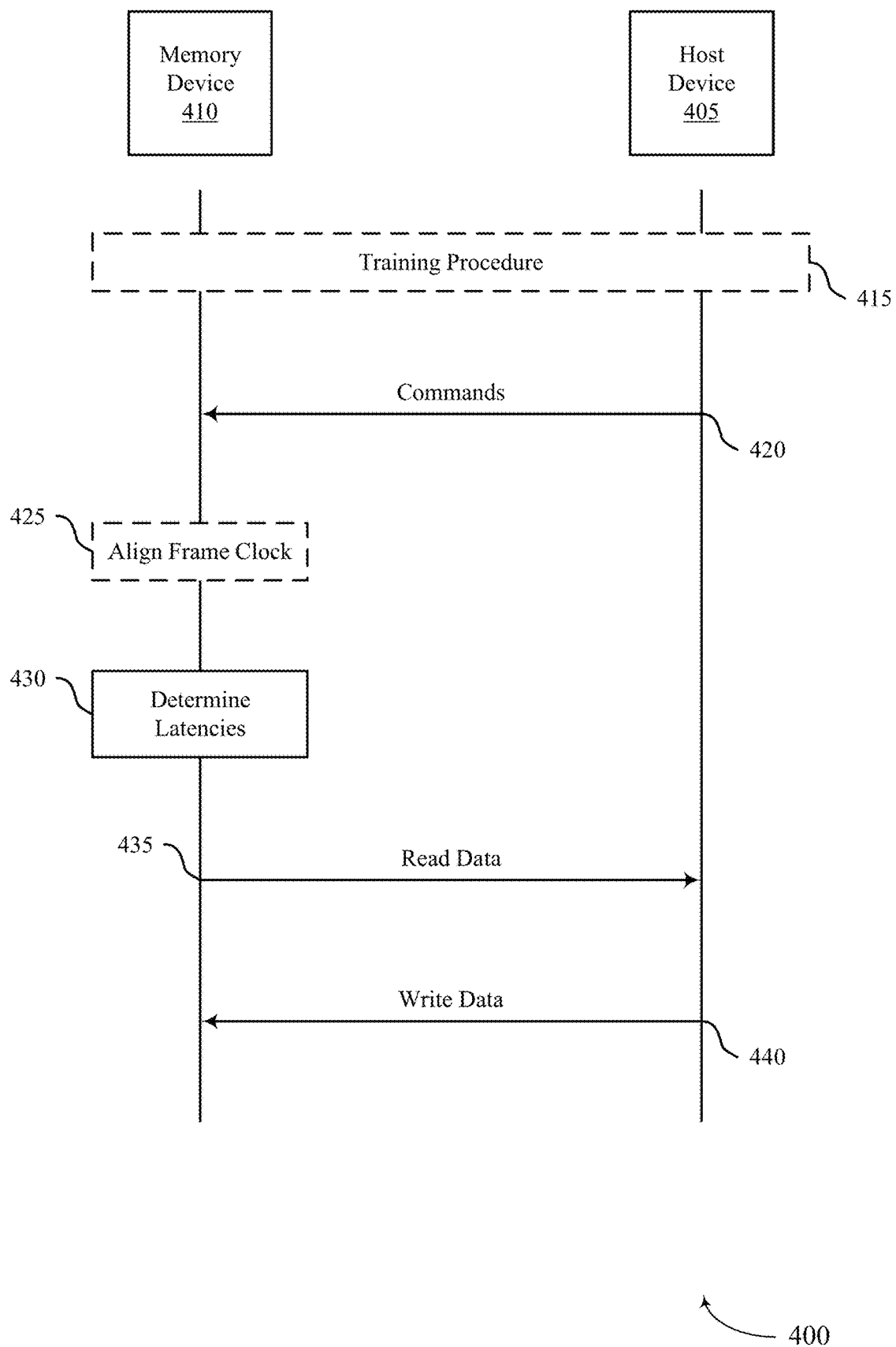
FIG. 4 illustrates an example of a process flow that supports latency offset for frame-based communications in accordance with examples as disclosed herein.

FIG. 4 illustrates an example of a process flow 400 that supports latency offset for frame-based communications in accordance with examples as disclosed herein. In some examples, the process flow 400 may illustrate implementation of aspects of the device 100 and the memory die 200 as described with reference to FIGS. 1 and 2. For example, the process flow 400 may include example transmissions or operations associated with one or more of a host device 405 and a memory device 410, which may be examples of the corresponding devices described with reference to FIGS. 1 and 2. In the following description of the process flow 400, the transmissions between the host device 405 and the memory device 410 may be transmitted in a different order than the example order shown, or the operations performed by the host device 405 and the memory device 410 may be performed in different orders or at different times. Some transmissions or operations may also be omitted from the process flow 400, and other transmissions or operations may be added to the process flow 400. The transmissions and operations performed by the host device 405 and the memory device 410 may support improvement to the memory device 410 operations and, in some examples, may promote improvements to communication reliability between the host device 405 and the memory device 410, among other benefits. In some examples, the process flow 400 may implement aspects of a read-modify-write command.

At 415 the host device 405 and the memory device 410 may jointly perform a training procedure. For example, the host device 405 may initiate a frame training procedure at the memory device 410 as described with reference to FIG. 3. Based on the training procedure, the memory device 410 may generate a frame clock for processing commands and data from the host device 405.

At 420, the host device 405 may transmit a read command and a write command to the memory device 410. The read command and write command may both be part of a read-modify-write command where the host device 405 reads data in the memory device 410, may modify that data, and writes that data (modified or not) back to the memory device 410 immediately after. Because of the close proximity in time of the read command and the write command, delays and offsets may be used to ensure that there are no collisions on the data bus. The features described in In some examples, the memory device 410 may receive the read command in a first frame period and the write command in a second frame period. The write command may immediately follow the read command. In some examples, the read command and the write command may be combined in a read-write command from the host device 405.

In some examples, at 425 the memory device 410 may align the generated frame clock based on the frame periods associated with the read command and the write command. That is, the memory device 410 may use the frame periods to maintain frame clock alignment with the host device 405.

At 430, the memory device 410 may determine latencies for data associated with the received commands. That is, the memory device 410 may determine a read latency associated with read data transmitted from the memory device 410 to the host device 405. Similarly, the memory device 410 may determine a write latency associated with write data transmitted from the host device 405 to the memory device 410. In some examples, the write latency may be programmed to allow the write data to arrive at the memory device 410 immediately following transmission of the read data, to enable efficient utilization of a data bus between the memory device 410 and the host device 405. The write latency may include an integer quantity of frame periods of the frame clock. The read latency may similarly be programmed as an integer quantity of frame periods, but a delay through circuitry on the memory device 410 and the host device 405 may arrive at a time after the programmed latency. Because the additional circuit delay may be unknown, this may lead to contention between the read data and the write data on a data bus.

To reduce the data bus contention and improve communications reliability, the memory device 410 may determine an additional offset latency to add to the write latency. The offset latency may correspond to an integer quantity of clock periods of a system clock (e.g., a WCK), and may be less than a frame period of the generated frame clock at the memory device 410. In some examples, the memory device 410 and the host device 405 may determine the offset latency during the frame training procedure. Additionally or alternatively, the offset latency may be programmed into a mode register of the memory device 410.

At 435, the memory device 410 may transmit the read data to the host device 405 following the programmed read latency and the additional circuit delay. The read data may be transmitted in frames aligned to a clock at the memory device 410 (e.g., an RCK). At 440, the host device 405 may transmit the write data to the memory device 410 following the programmed write latency and the offset latency. The offset latency timing may improve communications efficiency between the memory device 410 and the host device 405, among other benefits.

Figure 5:
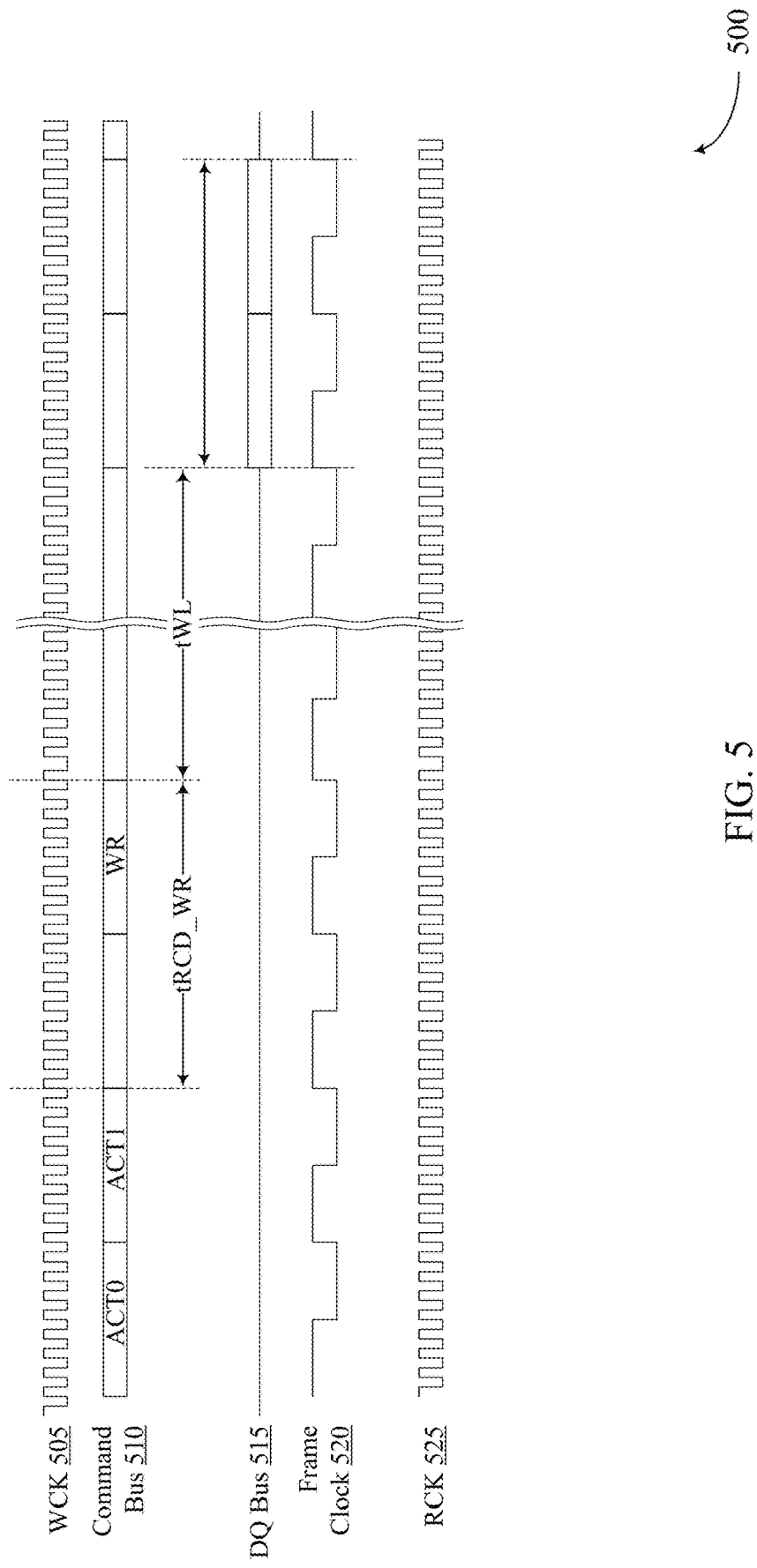
FIG. 5 illustrates an example of a timing diagram that supports latency offset for frame-based communications in accordance with examples as disclosed herein.

FIG. 5 illustrates an example of a timing diagram 500 that supports latency offset for frame-based communications in accordance with examples as disclosed herein. The timing diagram 500 may include aspects as described with reference to FIGS. 1 and 2. For example, the signals shown in the timing diagram 500 may correspond to signals generated by a memory device or a host device, which may be examples of corresponding devices described with reference to FIGS. 1 and 2. The timing diagram 500 may illustrate signals of a WCK 505, a command bus 510, a DQ bus 515, a frame clock 520, and an RCK 525.

Commands and data may be transmitted in frames (e.g., packets) based on a reference frame clock generated by the host device (e.g., a memory controller). The frame clock may be implied by the boundaries of the fixed length. The memory device (which may be a DRAM) may be initialized and trained by the host device to align to the reference frame clock boundaries with the frame clock 520 reproduced internally at the memory device. The frame clock itself may not be transmitted between the host device and the memory device, but the frame clock may be implied by the frame boundaries during frame training as the memory device adjusts its internally generated frame clock 520 to a predetermined, repeating a training frame. After frame clock training (which may include the frame training procedure described with reference to FIG. 3), a read data discrete latency and a write data discrete latency (e.g., a time from a write/read command to data on the DQ bus 515), expressed as a quantity of frame cycles, may be programmed into latency mode registers of the memory device based on data sheet specifications or system requirements. In some examples, the memory device and the host device may use a data strobe clock and a command clock (not shown) for capturing data and commands respectively at input circuits of the memory device. Write latency may be measured as a discrete quantity of command clock cycles because the command clock may be a continuous reference, while the data strobe clock may be aperiodic. Write latency in a two-clock system may use training procedures so that the host device may align the data strobe clock with the command clock at internal points in a logic path of the memory device so that an expected data arrival time, referenced to the command clock, coincides with the corresponding first data edge of the data strobe clock in the data path of the memory device.

As illustrated in FIG. 5, a single clock (e.g., the WCK 505) may be used to capture both command and write data. The RCK 525 may represent the read return clock, which may be phase aligned to read data from the memory device to the host device. Command and data may be aligned to the same data capture clock at the memory device. The host device may use the same frame clock reference for both write data and commands, which may align unit intervals (UIs) and frame clock boundaries between commands and write data internally at the memory device. As a part of UI training, the WCK 505 may be aligned to the center of a valid data "eye" for command and data. Once UI training has been completed, frame clock training may occur for the command bus 510. During frame clock training, the memory device may make UI adjustments and internally generate a corresponding frame clock 520 until the captured frames match a predetermined data pattern sent from the host device, for example as described with reference to FIG. 3. The host device reference frame clock (not shown) may synchronize command and data frames so that command and data frames are aligned at the memory device. A method for checking that data and command frames are aligned when transmitted to the memory device may be included in a training algorithm to ensure correct operation. For example, the training algorithm may include checking that a predefined pattern is properly received on both the DQ bus 515 and the command bus 510. With frame clock aligned for data and command timing at the memory device, write data latency may be directly timed at the memory device by a discrete numerical quantity of frame clock cycles.

In some examples, the memory device may determine an additional offset latency, which may be added to the write data latency associated with a write command in order to avoid bus contention between read data from the memory device and write data from the host device. The offset latency may correspond to an integer quantity of clock periods of the WCK 505, which may be less than a frame period of the generated frame clock 520. Determining the offset latency may improve communications reliability between the memory device and the host device, among other benefits.

Figure 6A:
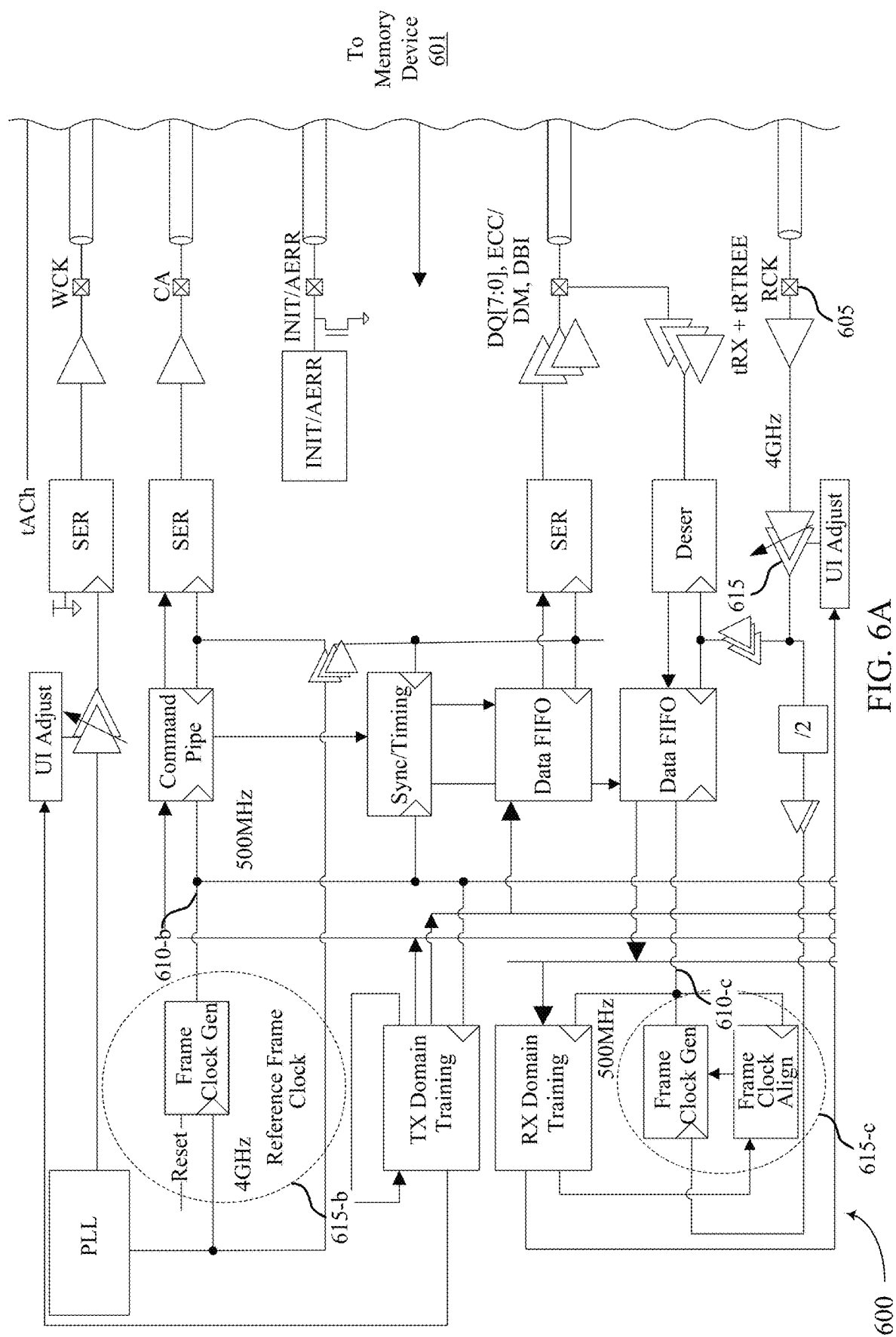
FIGS. 6A and 6B illustrate an example system and circuitry that support latency offset for frame-based communications in accordance with examples as disclosed herein.
Figure 6B:
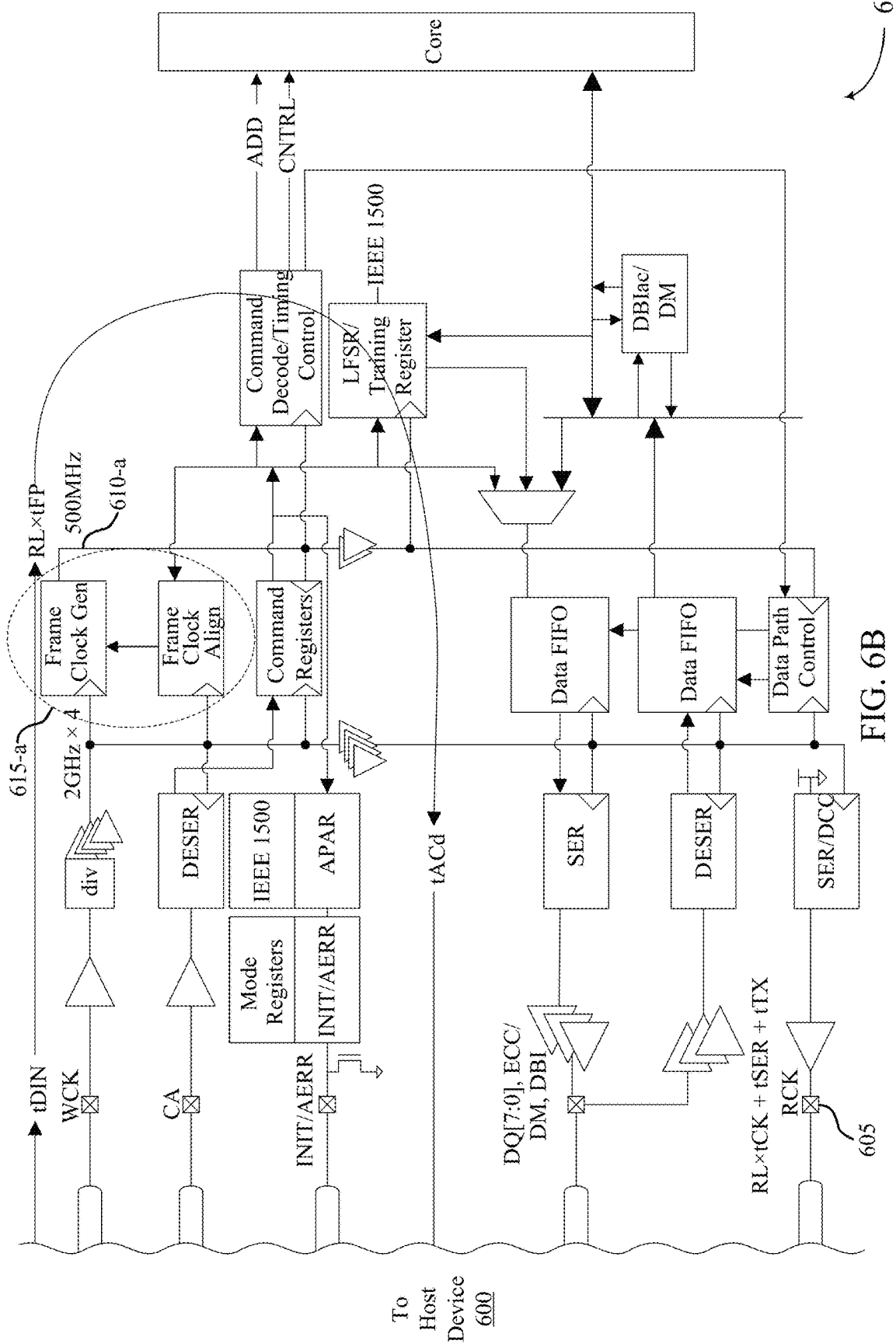

FIGS. 6A and 6B illustrate an example system and circuitry that support latency offset for frame-based communications in accordance with examples as disclosed herein. The system may include circuitry of a host device 600 and circuitry of a memory device 601, which may be examples of the corresponding devices described with reference to FIGS. 1 and 2.

The frame-based protocol described herein may reduce pin count and simplify communications between the host device 600 and the memory device 601 by not adding clock synchronization circuitry (e.g., phase lock loop (PLL) circuitry, delay lock loop (DLL) circuitry, etc.) to a logic path of the memory device 601. In some examples, the clock synchronization circuitry may internally align the launch of an output clock of the memory device 601 (e.g., an RCK 605) so that read data aligns to a continuously running command clock. This may allow the host device 600 to time read data latency based on a discrete numerical quantity of command clock cycles. However, the clock synchronization circuitry may consume power and area, and in some examples may complicate output timing from the memory device 601. Further, including independent PLL or DLL circuits for each channel in a multi-channel memory device 601 may not be feasible due to limitations on power, area, complexity, etc.

In some examples, a host device 600 may use burst strobes that indicate data arrival when toggles on the strobe signals are detected. However, these types of interfaces may use several training cycles to align the transmitting and receiving data for UI capture and have data latency that is referenced to a continuously running command clock. These interfaces may also align strobe transitions to the command clock for deterministic latency.

For the frame clock-based latency and frame alignment described herein, a reference frame clock 610-a for commands and data transmitted to the memory device 601 may be continuous following UI and frame clock training to maintain frame clock alignment. The reference frame clock 610-a may be generated using circuitry 615-a. The frame clock training may include the frame training procedure described with reference to FIG. 3. The frame clock implied in the read return data to the host device 600 may not have a direct timing relationship to a command and write data reference frame clock 610-b used for communication from the host device 600 to the memory device 601.

Read data latency (e.g., latency associated with data transmitted from the memory device 601 to the host device 600 following a read command) may be complicated by the lack of a frame clock reference between the frame clock 610-a at the memory device 601 and data capture circuits 620 at the host device 600. The frame clock 610-a may be based on the reference frame clock 610-b generated using circuitry 615-b at the host device 600, but a phase relationship between the frame clock 610-a and the reference frame clock 610-b may be ambiguous due to an I/O delay and clock distribution delays through the memory device 601. In one example, the memory device 601 may transmit training frames to the host device 600, which the host device 600 may use to generate a frame clock 610-c using circuitry 615-c. The frame clock 610-c may not be aligned with the reference frame clock 610-b, but the frame clock 610-c may align to frame boundaries of the read data. The host device 600 may then track the read latency in frame cycles following an initial training. This may be accomplished using clock domain crossing techniques at the host device 600 between the reference frame clock 610-b and the data receive frame clock 610-c.

Figure 7:
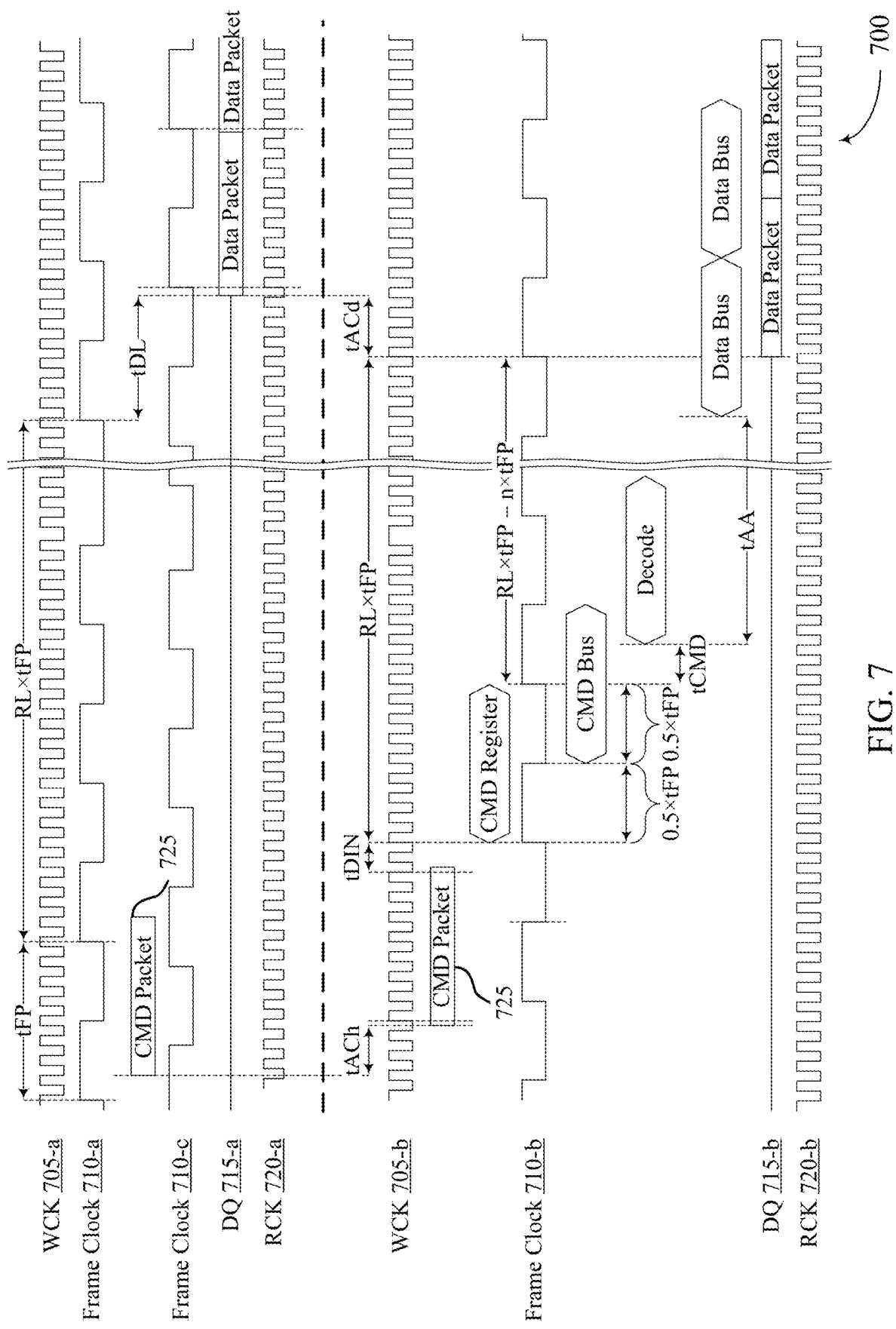
FIG. 7 illustrates an example of a timing diagram that supports latency offset for frame-based communications in accordance with examples as disclosed herein.

FIG. 7 illustrates an example of a timing diagram 700 that supports latency offset for frame-based communications in accordance with examples as disclosed herein. The timing diagram 700 may include aspects as described with reference to FIGS. 1, 2, and 6. For example, the signals shown in the timing diagram 700 may correspond to signals generated by a memory device or a host device, which may be examples of corresponding devices described with reference to FIGS. 1, 2, and 6. The timing diagram 700 may illustrate signals of WCKs 705, frame clocks 710, DQ buses 715, and RCKs 720.

The timing diagram 700 may illustrate delays for read return data driven from a memory device to a host device. The host device may issue a read command to the memory device through a serialization circuit, as illustrated in FIG. 6A. The read command may be included in a command frame 725. A delay between issuing the command frame 725 at the host device and receiving the command frame 725 at the memory device may be defined as tACh. Deserialization and receiver delay at the memory device may be defined as tDIN. The memory device may decode the command frame 725 and issue an array access. The memory device may wait according to a programmed latency RLxtFP, where tFP may be defined as a period of a frame clock 710 (e.g., 16 UI). Once the programmed latency expires, the memory device may drive data and the RCK 720 to the host device with a delay tACd. The read latency may be programmed as a discrete numerical quantity of frame periods, but the delay through circuitry on the memory device and the host device may be such that the read data may arrive at a time tDL (e.g., a sum of the circuit delays) after the programmed latency, as illustrated in FIG. 7. The programmed, discrete portion of read latency may be configured to mask a variation of array access delay. Through initialization training (e.g., the frame training procedure described with reference to FIG. 3), the host device may adjust a generated frame clock 710-c based on the timing of the RCK 720 to align with the frame boundaries driven from the memory device. The RCK 720 and the WCK 705 may run continuously following the frame training sequence to maintain the frame boundary relationships for communication between the memory device and the host device.

In some examples, the circuit delay tDL may lead to data contention on the DQ bus 715. For example, if a write latency is programmed to allow write data to arrive at the memory device immediately following transmission of the read data, the additional circuit delay included in the read latency may result in contention between the read data and the write data on the DQ bus 715. Such scenarios may occur with read-modify-write commands. To reduce the data bus contention and improve communications reliability, the memory device may determine an additional offset latency to add to the write latency. The offset latency may correspond to an integer quantity of clock periods of the WCK 705, and may be less than a frame period of the generated frame clock 710-b. In some examples, the memory device and the host device may determine the offset latency during a frame training procedure. Additionally or alternatively, the offset latency may be programmed into a mode register of the memory device.

Figure 8:
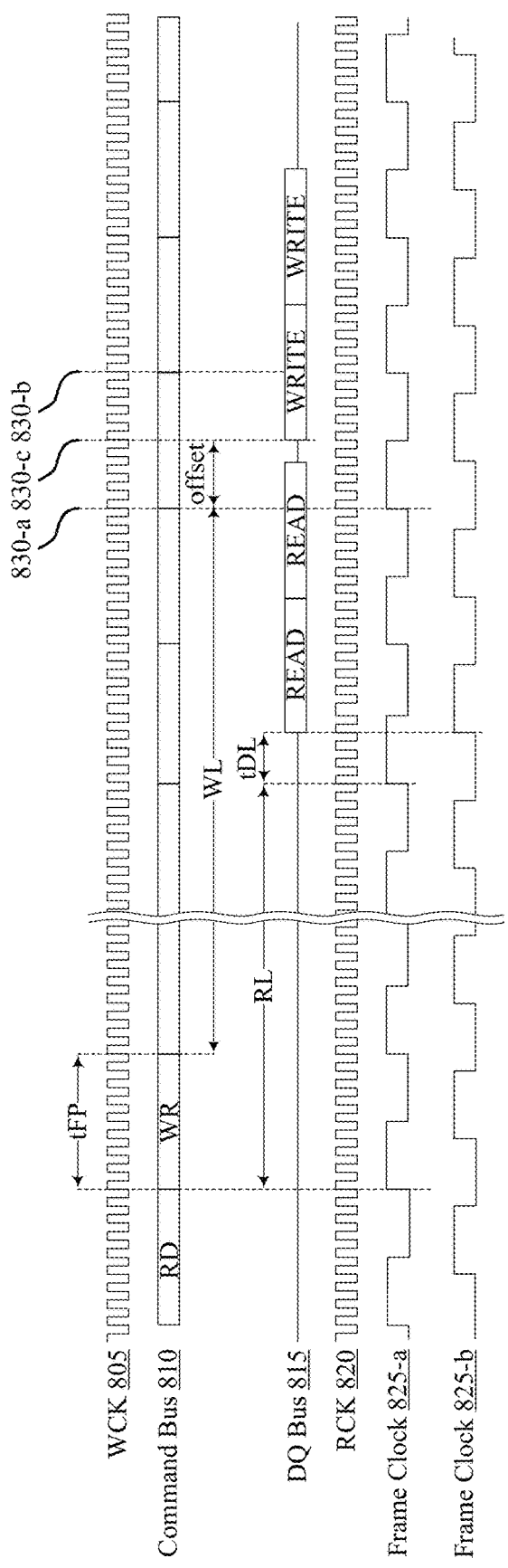
FIG. 8 illustrates an example of a timing diagram that supports latency offset for frame-based communications in accordance with examples as disclosed herein.

FIG. 8 illustrates an example of a timing diagram 800 that supports latency offset for frame-based communications in accordance with examples as disclosed herein. The timing diagram 800 may include aspects as described with reference to FIGS. 1, 2, and 6. For example, the signals shown in the timing diagram 800 may correspond to signals generated by a memory device or a host device, which may be examples of corresponding devices described with reference to FIGS. 1, 2, and 6. The timing diagram 800 may illustrate signals of a WCK 805, a command bus 810, a DQ bus 815, an RCK 820, and frame clocks 825.

A memory device may receive a read command identifying read data, followed by a write command identifying write data. The commands may be received on the command bus 810. The read command may indicate the read data is to be transmitted to the host device (e.g., on the DQ bus 815) after a quantity of frames following the read command, where the quantity of frames may correspond to a read latency (illustrated in FIG. 8 as RL). Similarly, the write command may indicate the write data is to be received from the host device after a quantity of frames following the write command, where the quantity of frames may correspond to a write latency (illustrated in FIG. 8 as WL). The write latency may be interpreted to arrive at the memory device based on a discrete numerical quantity of frame periods without any included circuit delay because the command and data see the same delay path into the memory device (e.g., via the command bus 810 and the DQ bus 815, respectively). The latency count established at the host device may be transmitted to the memory device. However, for read latency, the direct connection to the discrete portion of latency may be disconnected from the host device by the circuit delay tDL of the data access at the memory device. This may create a problem for read-to-write timing on the DQ bus 815. For example, if the write latency is programmed to allow the write data to arrive at a time 830-a immediately following the read data, the unknown circuit delay added to the read latency may result in bus contention between the read data and the write data.

In some examples, the write latency may be configured so that the write latency is a multiple integer of frame cycles after the read data to avoid the tDL delay added to the read latency. In such examples, the write latency may be configured as an integer of frame periods of the frame clock 825, such that the write data may arrive at a time 830-b. This may result in more data delay than is needed to avoid contention on the DQ bus 815 for read-to-write timing.

Because the WCK 805 is phase aligned to write data and the reference frame clock 825-a is based on the WCK 805, the WCK 805 may also serve as a timing reference for the write latency. The WCK 805 may enable a sub-frame delay for the write latency, which may be referred to as an offset latency. The offset latency may be defined as an integer numerical quantity of periods of the WCK 805 to add to the write latency to avoid contention for read-to-write timing on the bi-directional DQ bus 815. Based on adding the offset latency to the write latency, the write data may arrive at a time 830-*c*. This may result in more efficient bus utilization, as there may be less dead time on the DQ bus 815. This may in turn improve communications efficiency between the memory device and the host device, among other benefits.

The offset latency may be programmed into a mode register on the memory device. The host device may align write data based on the numerical quantity of periods of the WCK 805 in the offset latency in addition to the write latency programmed based on the frame clock 825-*a*. The offset latency may be programmed as an integer numerical quantity of periods or as an integer numerical quantity of UIs, which may allow for half cycle granularity with respect the WCK 805. The host device may determine the numerical quantity of offset cycles during the initialization and training of the communications channel, which may include the frame training procedure described with reference to FIG. 3. In one example, the offset latency may be determined by reading a pattern (e.g., a sequence of a same logic value, such as a logic 0 or a logic 1) from the memory device. The host device may estimate a numerical quantity of subframes (which may possibly be more than a period of the frame clock 825) when the read data arrives after the discrete, programmed read latency. The host device may then set the write offset latency to a value in order to avoid data contention. The offset latency may not apply to read latency, as read latency may have a non-deterministic component, and adding a subframe cycle granularity may not address this issue. Write-to-read latency may be dependent on write recovery time at the memory device and so may not be limited by efficiency of the DQ bus 815 in the same manner as read-to-write latency.

Figure 9:
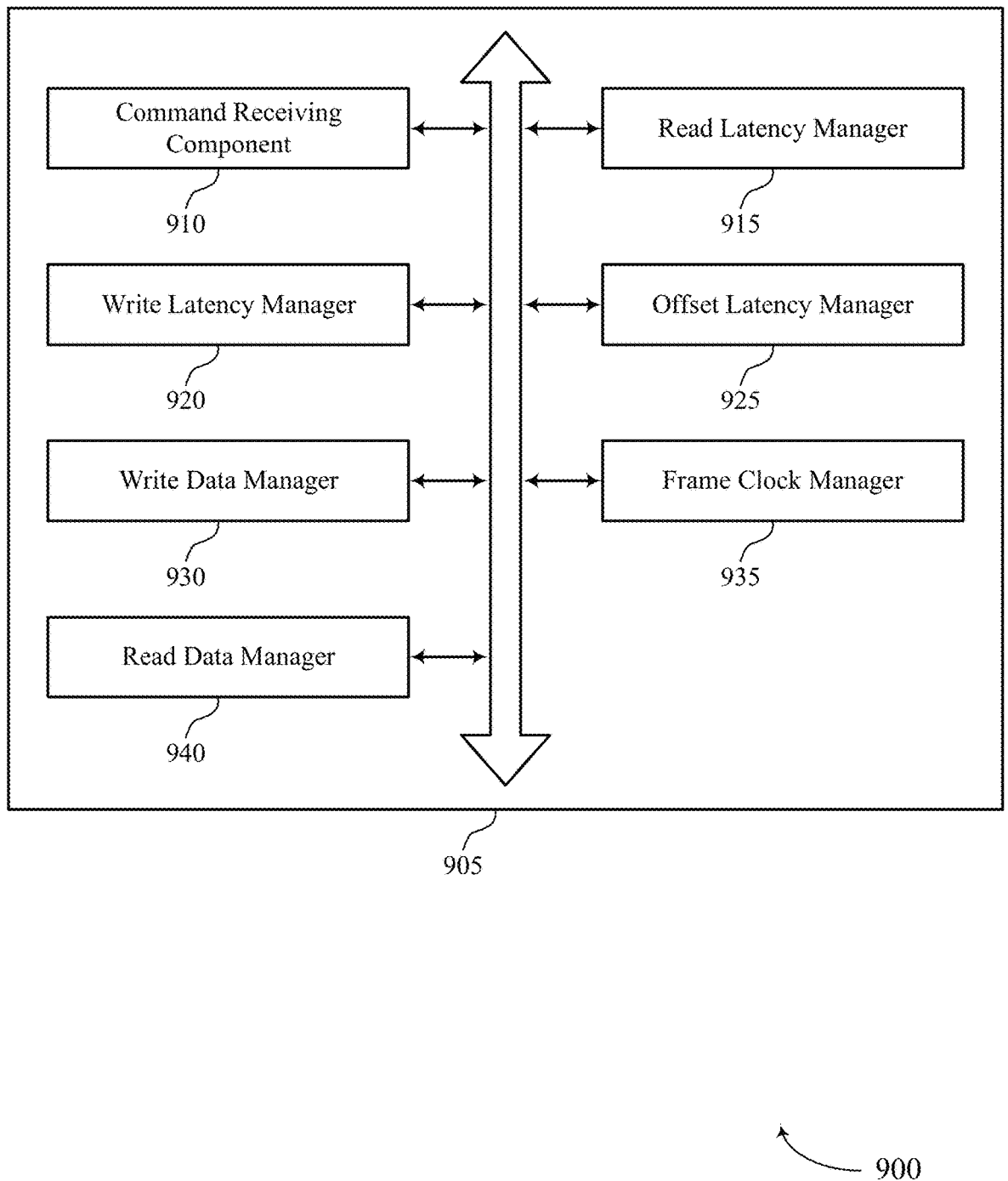
FIG. 9 shows a block diagram of a memory device that supports latency offset for frame-based communications in accordance with examples as disclosed herein.

FIG. 9 shows a block diagram 900 of a memory device 905 that supports latency offset for frame-based communications in accordance with examples as disclosed herein. The memory device 905 may be an example of aspects of a memory device as described with reference to FIGS. 1-8. The memory device 905 may include a command receiving component 910, a read latency manager 915, a write latency manager 920, an offset latency manager 925, a write data manager 930, a frame clock manager 935, and a read data manager 940. Each of these modules may communicate, directly or indirectly, with one another (e.g., via one or more buses).

The command receiving component 910 may receive, from a host device, a read command and a write command after receiving the read command. In some examples, the command receiving component 910 may receive the read command at a first frame period. In some examples, the command receiving component 910 may receive the write command at a second frame period different than the first frame period. In some cases, the second frame period may immediately follow the first frame period and the read command and the write command include a read-write command.

The read latency manager 915 may determine, for the read command, a read latency that includes a first integer quantity of frame periods of a frame clock at the memory device, where each frame period includes a second integer quantity of unit intervals of a first clock.

The write latency manager 920 may determine, for the write command, a write latency that includes a third integer quantity of frame periods of the frame clock greater than the first integer quantity. In some cases, the third integer quantity may be one number greater than the first integer quantity.

The offset latency manager 925 may determine, for the write command, an offset latency that includes a fourth integer quantity of unit intervals of the first clock, where the fourth integer quantity is less than the second integer quantity of unit intervals in a single frame period of the frame clock. In some examples, the offset latency manager 925 may retrieve the offset latency from a mode register of the memory device 905, where determining the offset latency may be based on retrieving the offset latency from the mode register. In some cases, the offset latency is determined as part of a training procedure associated with the data bus. In some examples, the offset latency manager 925 may program the offset latency to a mode register of the memory device 905 based on the training procedure. In some cases, the offset latency includes a fifth integer quantity of unit intervals of the first clock.

The write data manager 930 may write data associated with the write command at a frame period of the frame clock based on the write latency and the offset latency. In some examples, the write data manager 930 may write the write data to one or more memory cells of the memory device based on the write command.

The frame clock manager 935 may align the frame clock at the memory device 905 with the first frame period and the second frame period. In some cases, the first clock includes a write clock.

The read data manager 940 may retrieve read data associated with the read command from the one or more memory cells of the memory device 905. In some examples, the read data manager 940 may transmit, to the host device over the data bus, the read data at a frame period of the frame clock based on the read latency.

Figure 10:
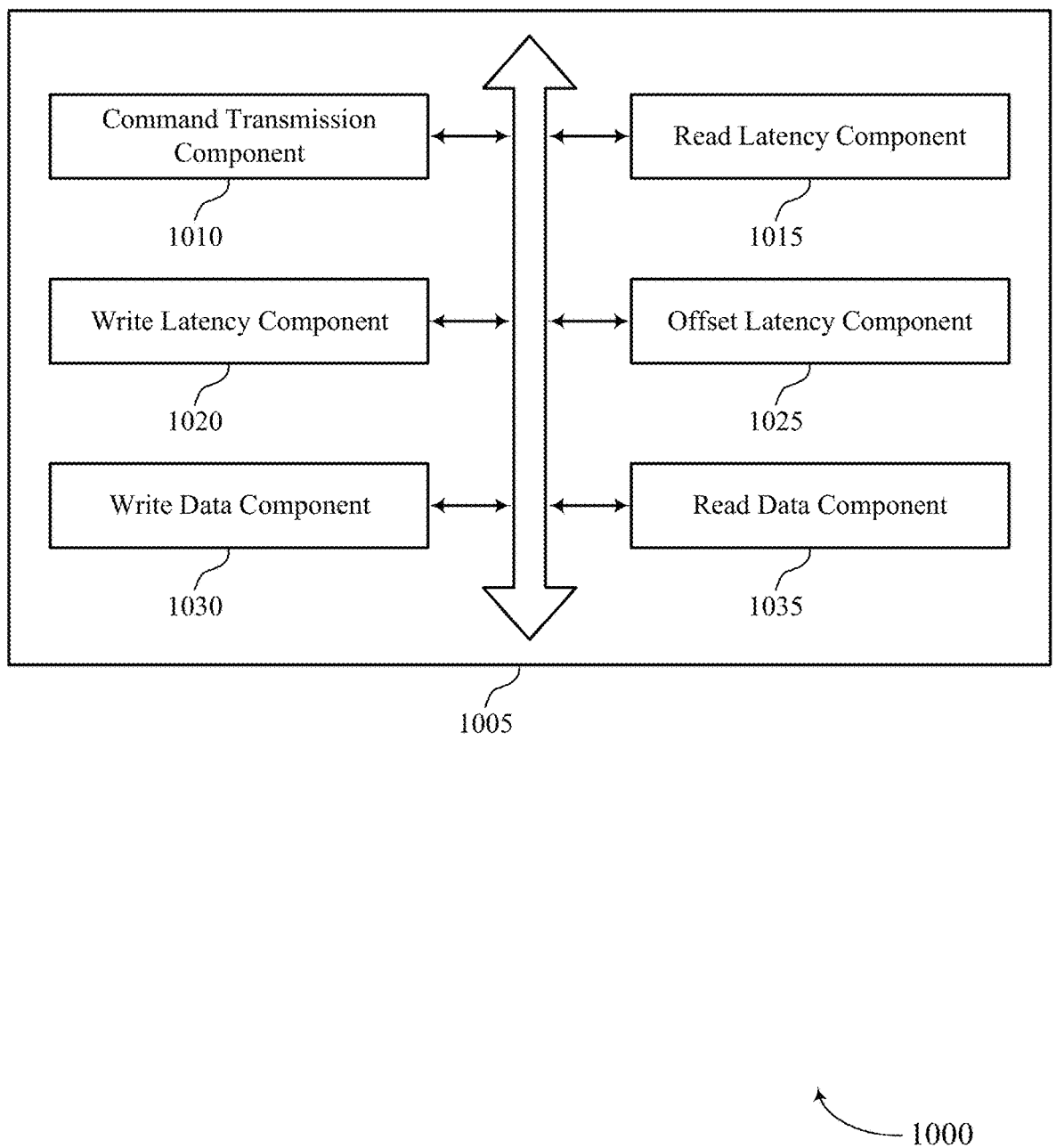
FIG. 10 shows a block diagram of a host device that supports latency offset for frame-based communications in accordance with examples as disclosed herein.

FIG. 10 shows a block diagram 1000 of a host device 1005 that supports latency offset for frame-based communications in accordance with examples as disclosed herein. The host device 1005 may be an example of aspects of a host device as described with reference to FIGS. 1-8. The host device 1005 may include a command transmission component 1010, a read latency component 1015, a write latency component 1020, an offset latency component 1025, a write data component 1030, and a read data component 1035. Each of these modules may communicate, directly or indirectly, with one another (e.g., via one or more buses).

The command transmission component 1010 may transmit, to a memory device, a read command and a write command after transmitting the read command. In some examples, the command transmission component 1010 may transmit the read command at a first frame period. In some examples, the command transmission component 1010 may transmit the write command at a second frame period different than the first frame period. In some cases, the second frame period immediately follows the first frame period and the read command and the write command include a read-write command.

The read latency component 1015 may determine, for the read command, a read latency that includes a first integer quantity of frame periods of a frame clock, where each frame period includes a second integer quantity of unit intervals of a first clock. In some cases, the first clock includes a write clock.

The write latency component 1020 may determine, for the write command, a write latency that includes a third integer quantity of frame periods of the frame clock greater than the first integer quantity. In some cases, the third integer quantity may be one number greater than the first integer quantity.

The offset latency component 1025 may determine, for the write command, an offset latency that includes a fourth integer quantity of unit intervals of the first clock, where the fourth integer quantity is less than the second integer quantity of unit intervals in a single frame period of the frame clock. In some cases, the offset latency is determined as part of a training procedure associated with the data bus. In some cases, the offset latency is retrieved from a mode register of the memory device. In some cases, the offset latency includes a fifth integer quantity of unit intervals of the first clock.

The write data component 1030 may transmit, to the memory device, write data associated with the write command, where the write data is received at a frame period based on the write latency and the offset latency. In some cases, the write data associated with the write command is transmitted over a data bus.

The read data component 1035 may receive, from the memory device over the data bus, read data associated with the read command at a frame period of the frame clock based on the read latency.

Figure 11:
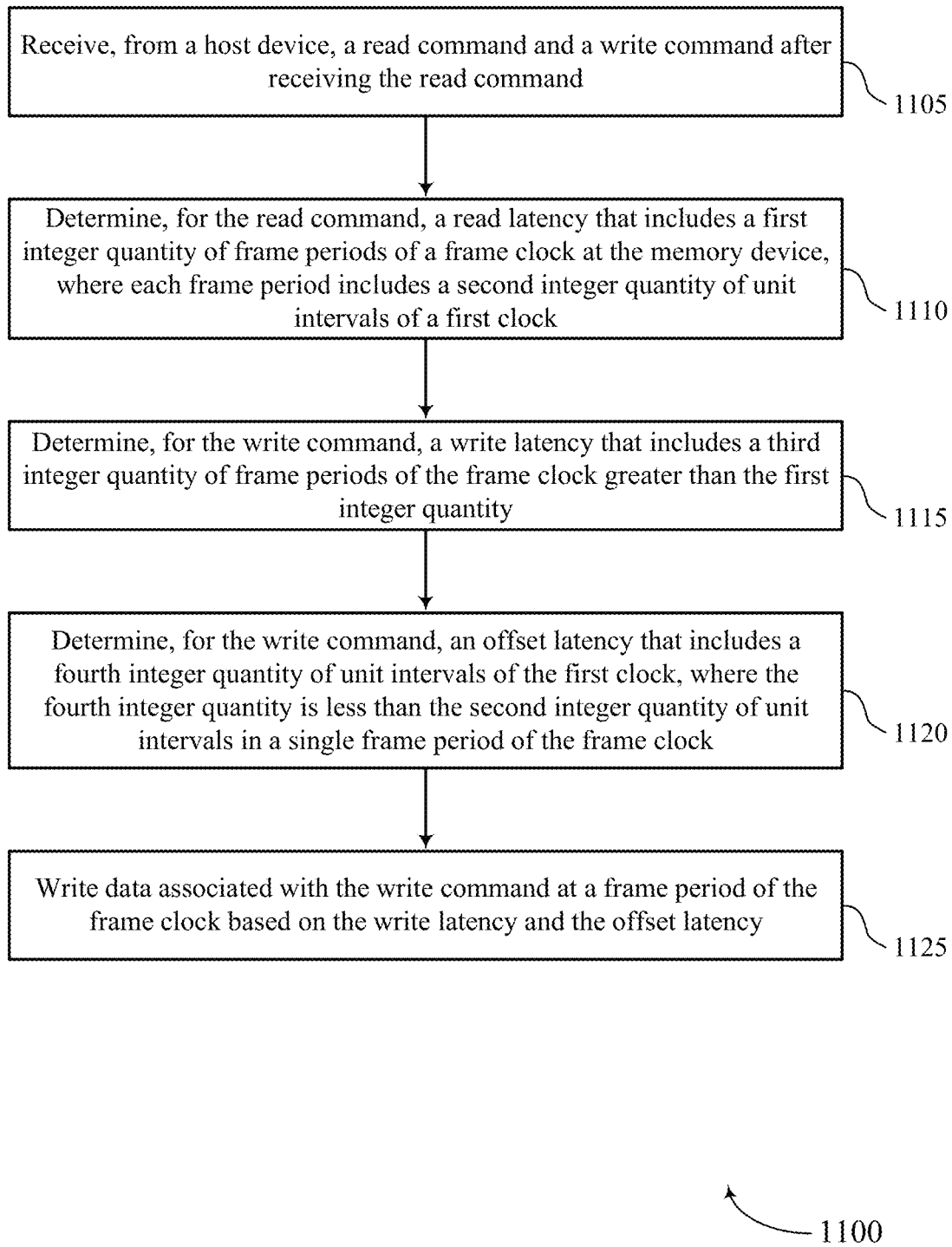
FIGS. 11 and 12 show flowcharts illustrating a method or methods that support latency offset for frame-based communications in accordance with examples as disclosed herein.

FIG. 11 shows a flowchart illustrating a method or methods 1100 that supports latency offset for frame-based communications in accordance with examples as disclosed herein. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1105, the memory device may receive, from a host device, a read command and a write command after receiving the read command. The operations of 1105 may be performed according to the methods described herein. In some examples, aspects of the operations of 1105 may be performed by a command receiving component as described with reference to FIG. 9.

At 1110, the memory device may determine, for the read command, a read latency that includes a first integer quantity of frame periods of a frame clock at the memory device, where each frame period includes a second integer quantity of unit intervals of a first clock. The operations of 1110 may be performed according to the methods described herein. In some examples, aspects of the operations of 1110 may be performed by a read latency manager as described with reference to FIG. 9.

At 1115, the memory device may determine, for the write command, a write latency that includes a third integer quantity of frame periods of the frame clock greater than the first integer quantity. The operations of 1115 may be performed according to the methods described herein. In some examples, aspects of the operations of 1115 may be performed by a write latency manager as described with reference to FIG. 9.

At 1120, the memory device may determine, for the write command, an offset latency that includes a fourth integer quantity of unit intervals of the first clock, where the fourth integer quantity is less than the second integer quantity of unit intervals in a single frame period of the frame clock. The operations of 1120 may be performed according to the methods described herein. In some examples, aspects of the operations of 1120 may be performed by an offset latency manager as described with reference to FIG. 9.

At 1125, the memory device may write data associated with the write command at a frame period of the frame clock based on the write latency and the offset latency. The operations of 1125 may be performed according to the methods described herein. In some examples, aspects of the operations of 1125 may be performed by a write data manager as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for receiving, from a host device, a read command and a write command after receiving the read command, determining, for the read command, a read latency that includes a first integer quantity of frame periods of a frame clock at the apparatus, where each frame period includes a second integer quantity of unit intervals of a first clock, determining, for the write command, a write latency that includes a third integer quantity of frame periods of the frame clock greater than the first integer quantity, determining, for the write command, an offset latency that includes a fourth integer quantity of unit intervals of the first clock, where the fourth integer quantity is less than the second integer quantity of unit intervals in a single frame period of the frame clock, and writing data associated with the write command at a frame period of the frame clock based on the write latency and the offset latency.

Some examples of the method 1100 and the apparatus described herein may further include operations, features, means, or instructions for receiving the read command at a first frame period, and receiving the write command at a second frame period different than the first frame period. Some examples of the method 1100 and the apparatus described herein may further include operations, features, means, or instructions for aligning the frame clock with the first frame period and the second frame period.

In some examples of the method 1100 and the apparatus described herein, the second frame period immediately follows the first frame period and the read command and the write command include a read-write command. Some examples of the method 1100 and the apparatus described herein may further include operations, features, means, or instructions for receiving the write data associated with the write command over a data bus between the apparatus and the host device.

Some examples of the method 1100 and the apparatus described herein may further include operations, features, means, or instructions for retrieving read data associated with the read command from the one or more memory cells of the array of memory cells, and transmitting, to the host device over the data bus, the read data at a second frame period of the frame clock based on the read latency. In some examples of the method 1100 and the apparatus described herein, the offset latency may be determined as part of a training procedure associated with the data bus. Some examples of the method 1100 and the apparatus described herein may further include operations, features, means, or instructions for programming the offset latency to a mode register of the memory device based on the training procedure.

In some examples of the method 1100 and the apparatus described herein, the first clock includes a write clock. In some examples of the method 1100 and the apparatus described herein, the third integer quantity may be one number greater than the first integer quantity. Some examples of the method 1100 and the apparatus described herein may further include operations, features, means, or instructions for retrieving the offset latency from a mode register of the apparatus, where determining the offset latency may be based on retrieving the offset latency from the mode register. In some examples of the method 1100 and the apparatus described herein, the offset latency includes a fifth integer quantity of unit intervals of the first clock.

Figure 12:
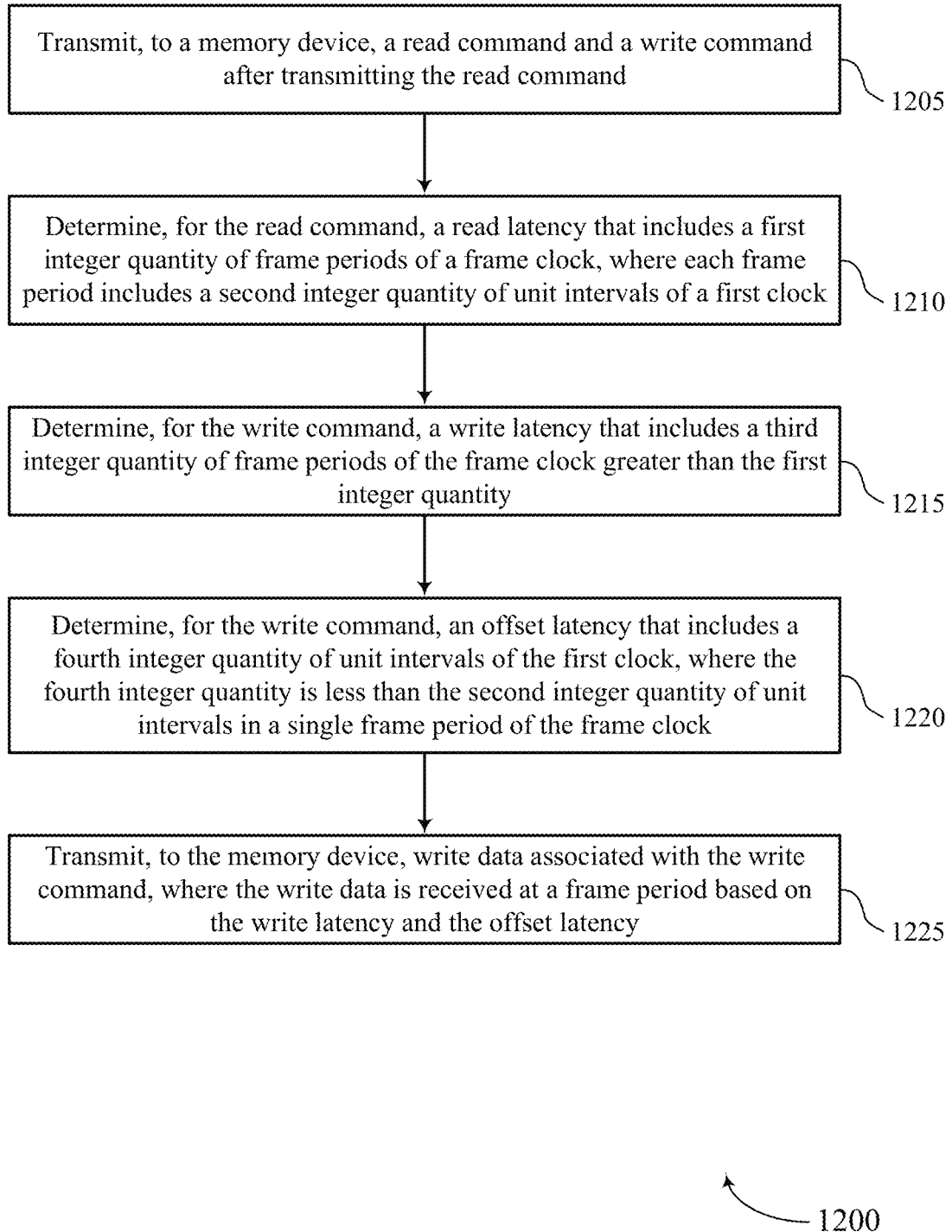

FIG. 12 shows a flowchart illustrating a method or methods 1200 that supports latency offset for frame-based communications in accordance with examples as disclosed herein. The operations of method 1200 may be implemented by a host device or its components as described herein. For example, the operations of method 1200 may be performed by a host device as described with reference to FIG. 10. In some examples, a host device may execute a set of instructions to control the functional elements of the host device to perform the described functions. Additionally or alternatively, a host device may perform aspects of the described functions using special-purpose hardware.

At 1205, the host device may transmit, to a memory device, a read command and a write command after transmitting the read command. The operations of 1205 may be performed according to the methods described herein. In some examples, aspects of the operations of 1205 may be performed by a command transmission component as described with reference to FIG. 10.

At 1210, the host device may determine, for the read command, a read latency that includes a first integer quantity of frame periods of a frame clock, where each frame period includes a second integer quantity of unit intervals of a first clock. The operations of 1210 may be performed according to the methods described herein. In some examples, aspects of the operations of 1210 may be performed by a read latency component as described with reference to FIG. 10.

At 1215, the host device may determine, for the write command, a write latency that includes a third integer quantity of frame periods of the frame clock greater than the first integer quantity. The operations of 1215 may be performed according to the methods described herein. In some examples, aspects of the operations of 1215 may be performed by a write latency component as described with reference to FIG. 10.

At 1220, the host device may determine, for the write command, an offset latency that includes a fourth integer quantity of unit intervals of the first clock, where the fourth integer quantity is less than the second integer quantity of unit intervals in a single frame period of the frame clock. The operations of 1220 may be performed according to the methods described herein. In some examples, aspects of the operations of 1220 may be performed by an offset latency component as described with reference to FIG. 10.

At 1225, the host device may transmit, to the memory device, write data associated with the write command, where the write data is received at a frame period based on the write latency and the offset latency. The operations of 1225 may be performed according to the methods described herein. In some examples, aspects of the operations of 1225 may be performed by a write data component as described with reference to FIG. 10.

In some examples, an apparatus as described herein may perform a method or methods, such as the method 1200. The apparatus may include features, means, or instructions (e.g., a non-transitory computer-readable medium storing instructions executable by a processor) for transmitting, o a memory device, a read command and a write command after transmitting the read command, determining, for the read command, a read latency that includes a first integer quantity of frame periods of a frame clock, where each frame period includes a second integer quantity of unit intervals of a first clock, determining, for the write command, a write latency that includes a third integer quantity of frame periods of the frame clock greater than the first integer quantity, determining, for the write command, an offset latency that includes a fourth integer quantity of unit intervals of the first clock, where the fourth integer quantity is less than the second integer quantity of unit intervals in a single frame period of the frame clock, and transmitting, to the memory device, write data associated with the write command, where the write data is received at a frame period based on the write latency and the offset latency.

Some examples of the method 1200 and the apparatus described herein may further include operations, features, means, or instructions for transmitting the read command at a first frame period, and transmitting the write command at a second frame period different than the first frame period. In some examples of the method 1200 and the apparatus described herein, the second frame period immediately follows the first frame period and the read command and the write command include a read-write command. In some examples of the method 1200 and the apparatus described herein, the write data associated with the write command may be transmitted over a data bus.

Some examples of the method 1200 and the apparatus described herein may further include operations, features, means, or instructions for receiving, from the memory device over the data bus, read data associated with the read command at a second frame period of the frame clock based on the read latency. In some examples of the method 1200 and the apparatus described herein, the offset latency may be determined as part of a training procedure associated with the data bus.

In some examples of the method 1200 and the apparatus described herein, the first clock includes a write clock. In some examples of the method 1200 and the apparatus described herein, the third integer quantity may be one number greater than the first integer quantity. In some examples of the method 1200 and the apparatus described herein, the offset latency may be retrieved from a mode register of the memory device. In some examples of the method 1200 and the apparatus described herein, the offset latency includes a fifth integer quantity of unit intervals of the first clock.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include an array of memory cells and a controller coupled with the array of memory cells, the controller operable to cause the apparatus to receive, from a host device, a read command and a write command after receiving the read command, determine, for the read command, a read latency that includes a first integer quantity of frame periods of a frame clock at the apparatus, where each frame period includes a second integer quantity of unit intervals of a first clock, determine, for the write command, a write latency that includes a third integer quantity of frame periods of the frame clock greater than the first integer quantity, determine, for the write command, an offset latency that includes a fourth integer quantity of unit intervals of the first clock, where the fourth integer quantity is less than the second integer quantity of unit intervals in a single frame period of the frame clock, and receive, from the host device, write data associated with the write command at a frame period of the frame clock based on the write latency and the offset latency.

In some examples, the controller may be further operable to cause the apparatus to receive the read command at a first frame period, and receive the write command at a second frame period different than the first frame period. In some examples, the controller may be further operable to cause the apparatus to align the frame clock with the first frame period and the second frame period. In some examples, the second frame period immediately follows the first frame period and the read command and the write command include a read-write command. In some examples, the controller may be further operable to cause the apparatus to receive the write data associated with the write command over a data bus between the apparatus and the host device.

In some examples, the controller may be further operable to cause the apparatus to retrieve read data associated with the read command from the one or more memory cells of the array of memory cells, and transmit, to the host device over the data bus, the read data at a frame period of the frame clock based on the read latency. In some examples, the offset latency may be determined as part of a training procedure associated with the data bus. In some examples, the apparatus may further include a mode register, where the controller may be further operable to cause the apparatus to retrieve the offset latency from the mode register, or program the offset latency to the mode register, or both.

An apparatus is described. The apparatus may include a processor operable to cause the apparatus to transmit, to a memory device, a read command and a write command after transmitting the read command, determine, for the read command, a read latency that includes a first integer quantity of frame periods of a frame clock, where each frame period includes a second integer quantity of unit intervals of a first clock, determine, for the write command, a write latency that includes a third integer quantity of frame periods of the frame clock greater than the first integer quantity, determine, for the write command, an offset latency that includes a fourth integer quantity of unit intervals of the first clock, where the fourth integer quantity is less than the second integer quantity of unit intervals in a single frame period of the frame clock, and transmit, to the memory device, write data associated with the write command, where the write data is received at a frame period based on the write latency and the offset latency.

In some examples, the processor may be further operable to cause the apparatus to transmit the read command at a first frame period, and transmit the write command at a second frame period different than the first frame period. In some examples, the second frame period immediately follows the first frame period and the read command and the write command include a read-write command. In some examples, the write data associated with the write command may be transmitted over a data bus. In some examples, the processor may be further operable to cause the apparatus to receive, from the memory device over the data bus, read data associated with the read command at a frame period of the frame clock based on the read latency.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

A system is described. The system may include a host device operable to transmit a read command and a write command after transmitting the read command, determine, for the read command, a read latency that includes a first integer quantity of frame periods of a frame clock, where each frame period includes a second integer quantity of unit intervals of a first clock, determine, for the write command, a write latency that includes a third integer quantity of frame periods of the frame clock greater than the first integer quantity, determine, for the write command, an offset latency that includes a fourth integer quantity of unit intervals of the first clock, where the fourth integer quantity is less than the second integer quantity of unit intervals in a single frame period of the frame clock, and transmit write data associated with the write command. The system may also include a memory device including a plurality of memory cells and operable to receive the read command and the write command after receiving the read command, determine the read latency for the read command, the write latency for the write command, and the offset latency for the write command, and receive the write data associated with the write command at a frame period of the frame clock based at least in part on the write latency and the offset latency.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a memory device from a host device, a read command and a write command after receiving the read command;
   determining, for the read command, a read latency that comprises a first integer quantity of frame periods of a frame clock at the memory device, wherein each frame period comprises a second integer quantity of unit intervals of a first clock;
   determining, for the write command, a write latency that comprises a third integer quantity of frame periods of the frame clock greater than the first integer quantity;
   determining, for the write command, an offset latency that comprises a fourth integer quantity of unit intervals of the first clock, wherein the fourth integer quantity is less than the second integer quantity of unit intervals in a single frame period of the frame clock; and
   writing data associated with the write command at a frame period of the frame clock based at least in part on the write latency and the offset latency.

2. The method of claim 1, further comprising:
   receiving the read command at a first frame period; and
   receiving the write command at a second frame period different than the first frame period.

3. The method of claim 2, further comprising:
   aligning the frame clock at the memory device with the first frame period and the second frame period.

4. The method of claim 2, wherein the second frame period immediately follows the first frame period and the read command and the write command comprise a read-write command.

5. The method of claim 1, further comprising:
   receiving the write data associated with the write command over a data bus between the memory device and the host device.

6. The method of claim 5, further comprising:
   retrieving read data associated with the read command from one or more memory cells of the memory device; and
   transmitting, to the host device over the data bus, the read data at a second frame period of the frame clock based at least in part on the read latency.

7. The method of claim 5, wherein the offset latency is determined as part of a training procedure associated with the data bus.

8. The method of claim 7, further comprising:
   programming the offset latency to a mode register of the memory device based at least in part on the training procedure.

9. The method of claim 1, wherein the first clock comprises a write clock.

10. The method of claim 1, wherein the third integer quantity is one number greater than the first integer quantity.

11. The method of claim 1, further comprising:
    retrieving the offset latency from a mode register of the memory device, wherein determining the offset latency is based at least in part on retrieving the offset latency from the mode register.

12. The method of claim 1, wherein the offset latency comprises a fifth integer quantity of unit intervals of the first clock.

13. A method, comprising:
    transmitting, at a host device to a memory device, a read command and a write command after transmitting the read command;
    determining, for the read command, a read latency that comprises a first integer quantity of frame periods of a frame clock, wherein each frame period comprises a second integer quantity of unit intervals of a first clock;
    determining, for the write command, a write latency that comprises a third integer quantity of frame periods of the frame clock greater than the first integer quantity;
    determining, for the write command, an offset latency that comprises a fourth integer quantity of unit intervals of the first clock, wherein the fourth integer quantity is less than the second integer quantity of unit intervals in a single frame period of the frame clock; and
    transmitting, to the memory device, write data associated with the write command, wherein the write data is received at a frame period based at least in part on the write latency and the offset latency.

14. The method of claim 13, further comprising:
    transmitting the read command at a first frame period; and
    transmitting the write command at a second frame period different than the first frame period.

15. The method of claim 14, wherein the second frame period immediately follows the first frame period and the read command and the write command comprise a read-write command.

16. The method of claim 13, wherein the write data associated with the write command is transmitted over a data bus.

17. The method of claim 16, further comprising:
    receiving, from the memory device over the data bus, read data associated with the read command at a second frame period of the frame clock based at least in part on the read latency.

18. The method of claim 16, wherein the offset latency is determined as part of a training procedure associated with the data bus.

19. The method of claim 13, wherein the first clock comprises a write clock.

20. The method of claim 13, wherein the third integer quantity is one number greater than the first integer quantity.

21. The method of claim 13, wherein the offset latency is retrieved from a mode register of the memory device.

22. The method of claim 13, wherein the offset latency comprises a fifth integer quantity of unit intervals of the first clock.

23. An apparatus, comprising:
an array of memory cells; and
a controller coupled with the array of memory cells, the controller configured to cause the apparatus to:
receive, from a host device, a read command and a write command after receiving the read command;
determine, for the read command, a read latency that comprises a first integer quantity of frame periods of a frame clock at the apparatus, wherein each frame period comprises a second integer quantity of unit intervals of a first clock;
determine, for the write command, a write latency that comprises a third integer quantity of frame periods of the frame clock greater than the first integer quantity;
determine, for the write command, an offset latency that comprises a fourth integer quantity of unit intervals of the first clock, wherein the fourth integer quantity is less than the second integer quantity of unit intervals in a single frame period of the frame clock; and
write data associated with the write command received at a frame period of the frame clock based at least in part on the write latency and the offset latency.

24. The apparatus of claim 23, wherein the controller is further configured to cause the apparatus to:
receive the read command at a first frame period; and
receive the write command at a second frame period different than the first frame period.

25. The apparatus of claim 24, wherein the controller is further configured to cause the apparatus to:
align the frame clock with the first frame period and the second frame period.

26. The apparatus of claim 24, wherein the second frame period immediately follows the first frame period and the read command and the write command comprise a read-write command.

27. The apparatus of claim 23, wherein the controller is further configured to cause the apparatus to:
receive the write data associated with the write command over a data bus between the apparatus and the host device.

28. The apparatus of claim 27, wherein the controller is further configured to cause the apparatus to:
retrieve read data associated with the read command from one or more memory cells of the array of memory cells; and
transmit, to the host device over the data bus, the read data at a second frame period of the frame clock based at least in part on the read latency.

29. The apparatus of claim 23, further comprising:
a mode register, wherein the controller is further configured to cause the apparatus to retrieve the offset latency from the mode register, or program the offset latency to the mode register, or both.

30. An apparatus, comprising:
a processor configured to cause the apparatus to:
transmit, to a memory device, a read command and a write command after transmitting the read command;
determine, for the read command, a read latency that comprises a first integer quantity of frame periods of a frame clock, wherein each frame period comprises a second integer quantity of unit intervals of a first clock;
determine, for the write command, a write latency that comprises a third integer quantity of frame periods of the frame clock greater than the first integer quantity;
determine, for the write command, an offset latency that comprises a fourth integer quantity of unit intervals of the first clock, wherein the fourth integer quantity is less than the second integer quantity of unit intervals in a single frame period of the frame clock; and
transmit, to the memory device, write data associated with the write command, wherein the write data is received at a frame period based at least in part on the write latency and the offset latency.

31. The apparatus of claim 30, wherein the processor is further configured to cause the apparatus to:
transmit the read command at a first frame period; and
transmit the write command at a second frame period different than the first frame period.

32. The apparatus of claim 31, wherein the second frame period immediately follows the first frame period and the read command and the write command comprise a read-write command.

33. The apparatus of claim 30, wherein the write data associated with the write command is transmitted over a data bus.

34. The apparatus of claim 33, wherein the processor is further configured to cause the apparatus to:
receive, from the memory device over the data bus, read data associated with the read command at a second frame period of the frame clock based at least in part on the read latency.

35. A system, comprising:
a host device configured to:
transmit a read command and a write command after transmitting the read command;
determine, for the read command, a read latency that comprises a first integer quantity of frame periods of a frame clock, wherein each frame period comprises a second integer quantity of unit intervals of a first clock;
determine, for the write command, a write latency that comprises a third integer quantity of frame periods of the frame clock greater than the first integer quantity;
determine, for the write command, an offset latency that comprises a fourth integer quantity of unit intervals of the first clock, wherein the fourth integer quantity is less than the second integer quantity of unit intervals in a single frame period of the frame clock; and
transmit write data associated with the write command; and
a memory device comprising a plurality of memory cells and configured to:
receive the read command and the write command after receiving the read command;
determine the read latency for the read command, the write latency for the write command, and the offset latency for the write command; and
receive the write data associated with the write command at a frame period of the frame clock based at least in part on the write latency and the offset latency.

* * * * *